(12) United States Patent
Yamashita

(10) Patent No.: US 11,355,439 B2
(45) Date of Patent: Jun. 7, 2022

(54) STRUCTURE, METHOD FOR MANUFACTURING STRUCTURE, LAMINATE, AND SEMICONDUCTOR PACKAGE

(71) Applicant: FUJIFILM Corporation, Tokyo (JP)

(72) Inventor: Kosuke Yamashita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 338 days.

(21) Appl. No.: 16/775,497

(22) Filed: Jan. 29, 2020

(65) Prior Publication Data

US 2020/0168551 A1    May 28, 2020

Related U.S. Application Data

(63) Continuation of application No. PCT/JP2018/024088, filed on Jun. 26, 2018.

(30) Foreign Application Priority Data

Aug. 25, 2017  (JP) .............................. JP2017-162249

(51) Int. Cl.
  *H01L 23/538*  (2006.01)
  *H01L 21/48*   (2006.01)
  *H01L 25/16*   (2006.01)

(52) U.S. Cl.
  CPC ........ *H01L 23/5384* (2013.01); *H01L 21/486* (2013.01); *H01L 23/5385* (2013.01); *H01L 25/162* (2013.01)

(58) Field of Classification Search
  CPC ............. H01L 23/5384; H01L 23/5385; H01L 23/49827; H01L 21/486; H01L 25/162
  See application file for complete search history.

(56) References Cited

U.S. PATENT DOCUMENTS

| | | |
|---|---|---|
| 2008/0277776 A1 | 11/2008 | Enomoto |
| 2010/0294547 A1 | 11/2010 | Hatanaka et al. |
| 2011/0311800 A1 | 12/2011 | Yamashita et al. |

FOREIGN PATENT DOCUMENTS

| | | |
|---|---|---|
| JP | 2001-6770 A | 1/2001 |
| JP | 2002-141121 A | 5/2002 |
| JP | 2009-164095 A | 7/2009 |

(Continued)

OTHER PUBLICATIONS

Communication dated Jun. 28, 2021, issued by the Taiwanese Patent Office in application No. 107123081.

(Continued)

*Primary Examiner* — Tucker J Wright
(74) *Attorney, Agent, or Firm* — Sughrue Mion, PLLC

(57) ABSTRACT

A structure includes: a plurality of through holes that are provided to an insulating base and penetrate the insulating base in the thickness direction; conductive paths that are constituted of a conductive substance filling the plurality of through-holes; and insulators with which the plurality of through-holes are filled and are constituted of an insulating substance different from that of the insulating base. Both ends of the respective conductive paths are provided with protrusions that protrude from each surface of the insulating base in the thickness direction. Both ends of the insulators are flush with each surface of the insulating base in the thickness direction, protrude with respect to the surface in the thickness direction, or are recessed from the surface in the thickness direction.

10 Claims, 13 Drawing Sheets

(56) References Cited

FOREIGN PATENT DOCUMENTS

| | | |
|---|---|---|
| JP | 2010-033753 A | 2/2010 |
| JP | 2010-177171 A | 8/2010 |
| JP | 2012-009146 A | 1/2012 |
| TW | 200742018 A | 11/2007 |

OTHER PUBLICATIONS

International Search Report dated Sep. 18, 2018, issued by the International Searching Authority in application No. PCT/JP2018/024088.

Written Opinion dated Sep. 18, 2018, issued by the International Searching Authority in application No. PCT/JP2018/024088.

International Preliminary Report on Patentability dated Feb. 25, 2020, issued by the International Bureau in application No. PCT/JP2018/024088.

Communication dated Jan. 19, 2021, from the Japanese Patent Office in application No. 2019537953.

STRUCTURE, METHOD FOR MANUFACTURING STRUCTURE, LAMINATE, AND SEMICONDUCTOR PACKAGE

CROSS-REFERENCE TO RELATED APPLICATIONS

This application is a Continuation of PCT International Application No. PCT/JP2018/024088 filed on Jun. 26, 2018, which claims priority under 35 U.S.C § 119(a) to Japanese Patent Application No. 2017-162249 filed on Aug. 25, 2017. Each of the above application(s) is hereby expressly incorporated by reference, in its entirety, into the present application.

BACKGROUND OF THE INVENTION

1. Field of the Invention

The present invention relates to a structure having conductive paths constituted of a conductive substance filling a plurality of through-holes penetrating an insulating base in a thickness direction and insulators constituted of an insulating substance filling the plurality of through-holes, a method for manufacturing a structure, a laminate, and a semiconductor package.

2. Description of the Related Art

A structure formed by filling a plurality of through-holes provided in an insulating base with a conductive substance such as metal is one of the fields that have been attracting attention in nanotechnology in recent years, and for example, the use thereof as an anisotropic conductive member is expected.

An anisotropic conductive member is inserted between an electronic component such as a semiconductor element and a circuit board and electrical connection between the electronic component and the circuit board can be obtained simply by applying pressure. Thus, the anisotropic conductive member is widely used as an electrical connection member for an electronic component such as a semiconductor element and a connector for inspection in a case of performing a function inspection.

Particularly, downsizing of electronic components such as a semiconductor element remarkably occurs. In a method of directly connecting a wiring substrate such as conventional wire bonding, flip chip bonding, thermos compression bonding, and the like, an anisotropic conductive member is attracting attention as an electronic connection member since the stability of electrical connection of electronic components cannot be sufficiently ensured.

JP2010-033753A discloses a microstructure formed of an insulating base having micropore through-holes, which can be used as an anisotropic conductive member corresponding to a narrow pitch. The microstructure described in JP2010-033753A is formed of an insulating base having through-holes having a pore diameter of 10 to 500 nm at a density of $1 \times 10^6$ to $1 \times 10^{10}/mm^2$, in which the through-holes of 20% or more of the total number of through-holes are filled with a metal and the through-holes of 1% to 80% of the total number of through-holes are filled with a polymer.

JP2012-009146A discloses a microstructure in which the through-holes provided in an insulating base are filled with a metal and an insulating substance. In the microstructure described in JP2012-009146A, in the insulating base, the density of the through-holes is $1 \times 10^6$ to $1 \times 10^{10}/mm^2$, the average opening diameter of the through-holes is 10 to 5,000 nm, the average depth of the through-holes is 10 to 1,000 μm, the pore sealing ratio of the through-holes as attained by the metal alone is 80% or more, and the pore sealing ratio of the through-holes as attained by the metal and the insulating substance is 99% or more. The insulating substance is at least one selected from the group consisting of aluminum hydroxide, silicon dioxide, metal alkoxide, lithium chloride, titanium oxide, magnesium oxide, tantalum oxide, niobium oxide, and zirconium oxide.

JP2010-177171A discloses an anisotropic conductive member that has flexibility, can be used as a connection member for an electronic component such as a semiconductor element, an inspection connector, and the like, and is suitable for electrodes having a narrow pitch.

In the anisotropic conductive member described in JP2010-177171A, in the insulating base, a plurality of conductive paths formed of a conductive member penetrate through the insulating base in the thickness direction in a state in which the conductive paths are insulated from each other, and at least one end of each conductive path has a protrusion having a length of 5 μm to 100 μm from the surface of at least one surface of the insulating base. The ratio of the length of the protrusion with respect to the diameter of the conductive path is 3 or more, and in a case where the other end of each conductive path does not have a protrusion, the anisotropic conductive member is provided in a state of being exposed on the other surface of the insulating base.

SUMMARY OF THE INVENTION

In the structure described in JP2010-033753A, the through-holes are filled with a metal as described above, the through-holes of 1% to 80% of the total number of through-holes are filled with a polymer, and the polymer protrudes from the insulating base (refer to FIG. 1B in JP2010-033753A). Therefore, in a case where bonding is performed using the microstructure described in JP2010-033753A as an anisotropic conductive member, there is a problem that the deformation of the metal protruding from the insulating base may be inhibited by the polymer. As a result, physical bonding failure with another member may occur.

In the microstructure described in JP2012-009146A, in a case where the through-holes are sealed with an insulating substance, the surface of the insulating base is covered by the insulating substance in some cases. In this state, in a case where the member is used as an electronic connection member of a multilayer wiring substrate, there is a problem that electrical conduction failure and physical bonding failure may occur between the multilayer wiring substrate and the microstructure.

Although the anisotropic conductive member described in JP2010-177171A has protrusions having a length of 5 μm to 100 μm from at least one surface of the insulating base, in a case where the length of the protrusion is long and the protrusion collapses due to an external force or the like, there is a problem that the protrusions may come into contact with each other and cause a short circuit.

An object of the present invention is to solve the problems based on the above-described related art and to provide a structure that can be bonded to another member without causing a short circuit and has excellent electric conduction in a case where the structure is bonded to another member, a method for manufacturing a structure, a laminate, and a semiconductor package.

In order to achieve the above object, according to the present invention, there is provided a structure comprising: an insulating base; a plurality of through-holes that are provided in the insulating base and penetrate the insulating base in a thickness direction; conductive paths that are constituted of a conductive substance filling the plurality of through-holes; and insulators with which the plurality of through-holes are filled and are constituted of an insulating substance different from that of the insulating base, in which both ends of the respective conductive paths are provided with protrusions that protrude from each surface of the insulating base in the thickness direction, both ends of the insulators are flush with each surface of the insulating base in the thickness direction, protrude with respect to the surface in the thickness direction, or are recessed from the surface in the thickness direction, in a case where the insulators protrude, a protrusion length of the insulators is 30% or less of a protrusion length of the protrusions of the conductive paths, and in a case where the insulators are recessed, a recess length of the insulators is 10% or less of a thickness of the insulating base in the thickness direction.

It is preferable that a ratio of the protrusions in contact with each other is 10% or less of a total number of the conductive paths.

It is preferable that the conductive substance constituting the conductive path has a maximum stress of 100 MPa or less in an elastic region in a case where a compression load is applied.

According to the present invention, there is provided a method for manufacturing the structure comprising: a first step of forming an insulating structure including an insulating base having a plurality of through-holes extending in a thickness direction; a second step of filling the through-holes with a conductive substance; a third step of filling the through-holes, which are not filled with the conductive substance in the second step among the plurality of through-holes, with an insulating substance; and a fourth step of etching the insulating substance.

It is preferable that the fourth step is a step of etching the insulating base and the insulating substance at the same time and causing the conductive substance filled in the second step to protrude from a surface of the insulating base.

It is preferable that after the fourth step, a step of bringing the insulating base into contact with a liquid having a surface tension of 30 mN/m or less, and a step of drying the liquid are provided.

It is preferable that after the fourth step, a step of immersing the insulating base in a supercritical fluid is provided.

According to the present invention, there is provided a laminate comprising: the structure according to the present invention; and a wiring substrate having an electrode, in which the conductive path of the structure and the electrode are electrically connected.

It is preferable that a gap between the structure and the wiring substrate is filled with an insulating material.

In addition, according to the present invention, there is provided a semiconductor package comprising: a laminate including the structure according to the present invention, and a wiring substrate having an electrode, in which the conductive path of the structure and the electrode are electrically connected and a gap between the structure and the wiring substrate is filled with an insulating material.

According to the present invention, it is possible to provide a structure that can be bonded to another member without causing a short circuit and has excellent electric conduction in a case where the structure is bonded to another member.

DESCRIPTION OF THE PREFERRED EMBODIMENTS

Hereinafter, a structure, a method for manufacturing a structure, a laminate, and a semiconductor package according to embodiments of the present invention will be described in detail based on preferred embodiments shown in the accompanying drawings.

In addition, the drawings shown below are illustrations for describing the present invention, and the present invention is not limited to the drawings shown below.

The numerical range represented by the term "to" includes numerical values set forth before and after "to". For example, in a case where $\varepsilon 1$ is a numerical value $\alpha 1$ to a numerical value $\beta 1$, the range of $\varepsilon 1$ is a range including the numerical value $\alpha 1$ and the numerical value $\beta 1$, and expressed as $\alpha 1 \le \varepsilon 1 \le \beta 1$ by mathematical symbols.

"Specific numerical values" and the like include an error range generally allowed in the corresponding technical field unless otherwise specified. Further, "same" includes an error range generally allowed in the corresponding technical field.

Figure 1:
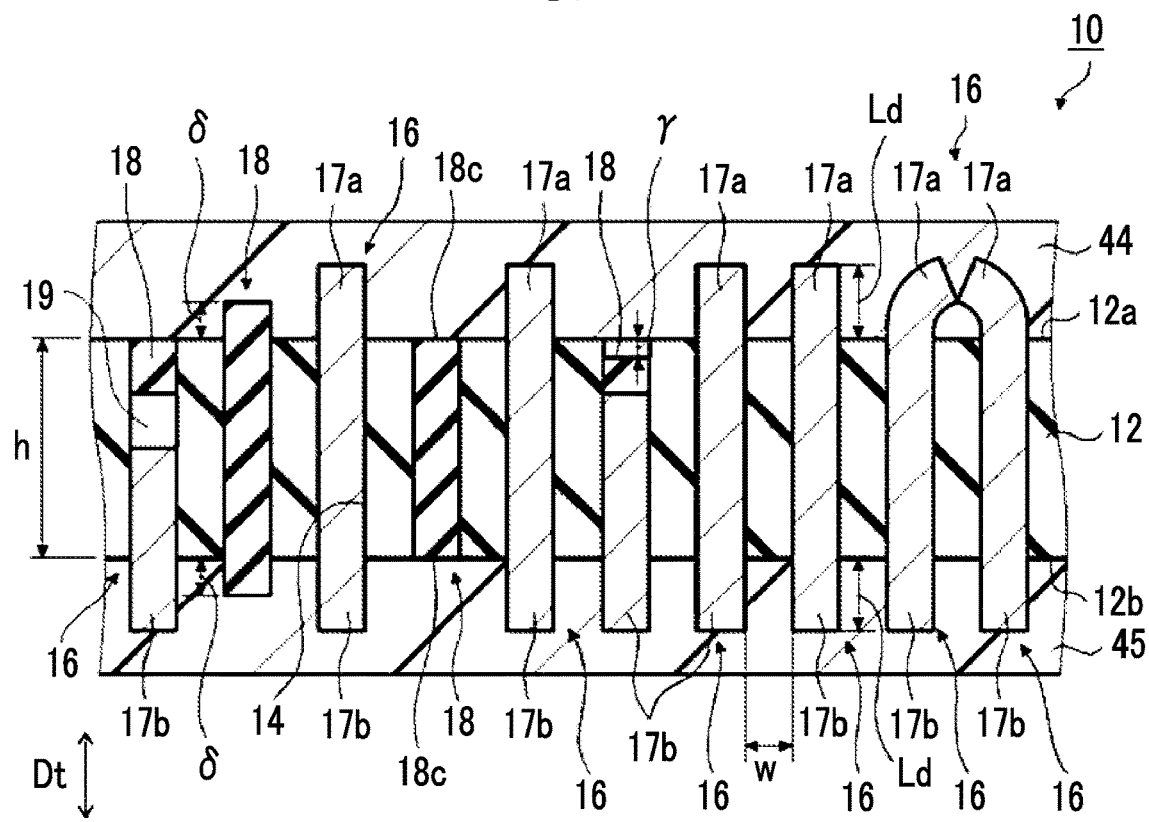
FIG. 1 is a schematic cross-sectional view showing an example of a structure according to an embodiment of the present invention.
Figure 2:
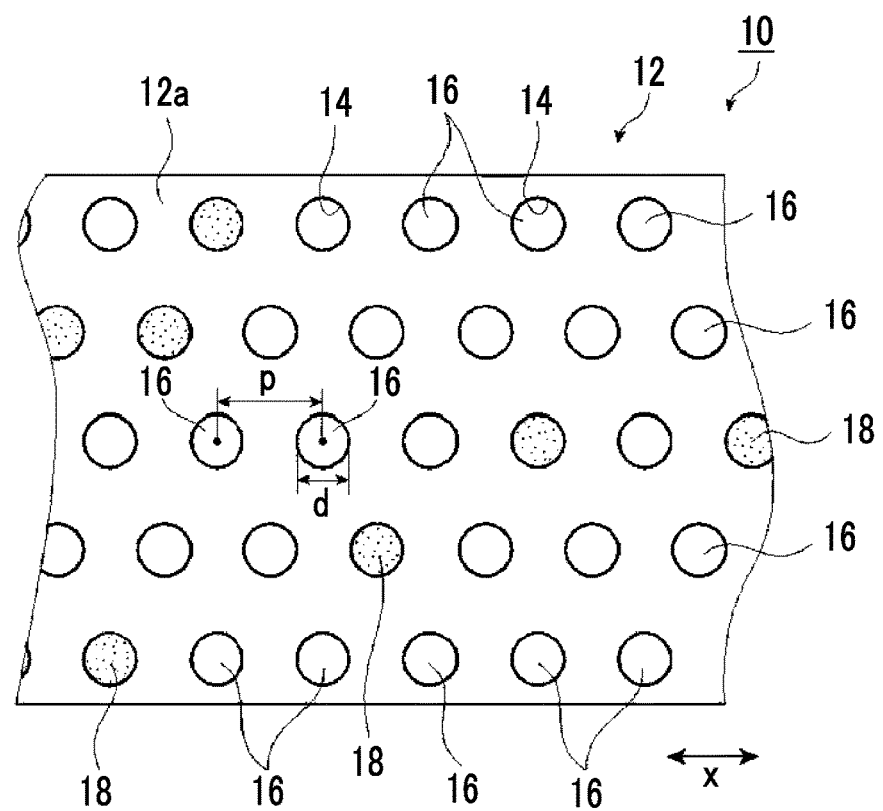
FIG. 2 is a schematic plan view showing the example of the structure according to the embodiment of the present invention.

FIG. 1 is a schematic cross-sectional view showing an example of a structure according to an embodiment of the present invention, and FIG. 2 is a schematic plan view showing an example of the structure according to the embodiment of the present invention.

A structure 10 shown in FIG. 1 includes an insulating base 12, a plurality of through-holes 14 that are provided in the insulating base 12 and penetrate the insulating base 12 in a thickness direction Dt, conductive paths 16 that are constituted of a conductive substance filling the plurality of through-holes 14, and insulators 18 that fill the plurality of through-holes 14 and are constituted of an insulating substance different from that of the insulating base 12. The plurality of conductive paths 16 exist in a state in which the conductive paths are electrically insulated from each other by the insulating base 12. In addition, the conductive path 16 has conductivity, functions as an electrical conductive path, and can transmit an electrical signal. The insulator 18 is not conductive, does not function as an electrical conductive path, and cannot transmit an electrical signal or the like.

The conductive path 16 includes protrusions 17a protruding from a front surface 12a of the insulating base 12 in the thickness direction Dt, and protrusions 17b protruding from a rear surface 12b.

As for the insulating substance that constitutes the insulator 18 and is different from the insulating base 12 does not include the insulator 18 in the insulating base 12, the insulator 18 does not include the insulating base 12.

The conductive substance constituting the conductive path 16 and the insulating substance constituting the insulator 18 will be described later.

In the structure 10, as shown in FIG. 2, the conductive paths 16 and the insulators 18 are provided in the insulating base 12 and the conductive paths 16 and the insulators 18 are mixed. All of the conductive paths 16 and the insulators 18 are formed in the through-holes 14 provided in the insulating base 12. Among the plurality of through-holes 14, the through-holes 14, which are not filled with the conductive substance constituting the conductive path 16, are filled with an insulating substance to form the insulators 18.

Both ends of the insulators 18 are flush with the front surface 12a or rear surface 12b of the insulating base 12 in the thickness direction Dt, protrude with respect to the surface in the thickness direction Dt, or are recessed from the surface in the thickness direction Dt.

The state in which the insulator 18 is flush with the front surface 12a or rear surface 12b of the insulating base 12 in the thickness direction Dt refers to a state in which an end surface 18c of each insulator 18 matches with the front surface 12a of the insulating base 12 or the rear surface 12b of the insulating base 12, and the end surface 18c of each insulator 18 does not protrude from the front surface 12a or rear surface 12b of the insulating base 12.

The insulator 18 includes an insulating protrusion in which a protrusion length $\delta$ of the insulator 18 is 30% or less of a protrusion length of the protrusion of the conductive path 16 protruding from the flush surface and/or an insulating recess in which a recess length (recess depth) $\gamma$ of the insulator 18 is 10% or less of the thickness of the insulating base 12 in the thickness direction Dt.

In a case where the insulator 18 protrudes from the front surface 12a or rear surface 12b in the thickness direction Dt, the protrusion length $\delta$ of the insulator 18 is 30% or less of the protrusion length of the protrusions 17a and 17b of the conductive path 16. When the protrusion length of the protrusions 17a and 17b of the conductive path 16 is Ld, the relationship of protrusion length $\delta \le$ protrusion length $Ld \times 0.3$ is satisfied.

As long as the relationship of protrusion length $\delta \le$ protrusion length $Ld \times 0.3$ is satisfied, in a case where the structure 10 is bonded to another member, the deformation of the conductive path 16 is not inhibited by the insulator 18. Thus, in a case where the structure 10 is used as, for example, an anisotropic conductive member, it is possible to obtain good conductivity and to reduce the occurrence of a short circuit.

It is more preferable that the lower limit of the protrusion length $\delta \le$ of the insulator 18 is more than 0 and the relationship of $0 <$ protrusion length $\delta \le$ protrusion length $Ld \times 0.3$ is satisfied.

In a case where the insulator 18 is recessed from the surface in the thickness direction Dt, the recess length (recess depth) $\gamma$ of the insulator 18 is 10% or less of the thickness of the insulating base 12 in the thickness direction Dt. That is, when the thickness of the insulating base 12 is h, the relationship of recess length $\gamma \le$ thickness h of insulating base $12 \times 0.1$ is satisfied. As long as the relationship of recess length $\gamma \le$ thickness h of insulating base $12 \times 0.1$ is satisfied, in a case where the structure 10 is bonded to another member, the collapse of the conductive path 16 is prevented. Thus, in a case where the structure 10 is used as, for example, an anisotropic conductive member, it is possible to obtain good conductivity and to reduce the occurrence of a short circuit.

It is more preferable that the lower limit of the recess length γ of the insulator 18 is more than 0 and the relationship 0<of recess length γ≤thickness h of insulating base 12×0.1 is satisfied.

In the structure 10, the conductive path 16 and the insulator 18 may be mixed in one through-hole 14. In addition, the conductive path 16, the insulator 18, and a void 19 may be mixed in one through-hole 14. In any case, the through-hole 14 is not conductive.

In the structure 10, by constituting the conductive path 16 and the insulator 18 to satisfy the above relationships, in a case where the structure 10 is used as, for example, an anisotropic conductive member, it is possible to obtain good conductivity and to reduce the occurrence of a short circuit.

The plurality of conductive paths 16 may be in contact with adjacent protrusions 17a and/or 17b, and the ratio of contact between the protrusions 17a or the protrusions 17b among the plurality of conductive paths 16 is preferably 10% or less of the total number of conductive paths 16.

As long as the ratio of the conductive paths in which the protrusions 17a or protrusions 17b are in contact with each other, among the plurality of conductive paths 16, is 10% or less of the total number of conductive paths 16, in a case where the structure 10 is used as, for example, an anisotropic conductive member, it is possible to reduce the occurrence of a short circuit.

The ratio of contact between the protrusions 17a or protrusions 17b is called a contact rate. For the contact rate, it is confirmed that whether adjacent conductive paths are in contact with each other for 100 conductive paths by taking a surface photograph (at a magnification of 100,000 times) with a field emission-scanning electron microscope (FE-SEM). The contact rate is calculated using the following equation.

Contact rate=((number of conductive paths in contact with adjacent conductive paths)/100)×100 (%)

Considering the ease of deformation in a case of bonding, the conductive substance constituting the conductive path 16 preferably has a maximum stress of 100 MPa or less in an elastic region in a case where a compression load is applied. That is, it is preferable that the elastic deformation maximum stress is 100 MPa or less. The elastic region is the load range governed by Hook's law. The maximum stress is the maximum value of the stress obtained by dividing the compression load by the cross-sectional area before applying the compression load, and.

The structure 10 can be used as an anisotropic conductive member, for example.

Figure 3:
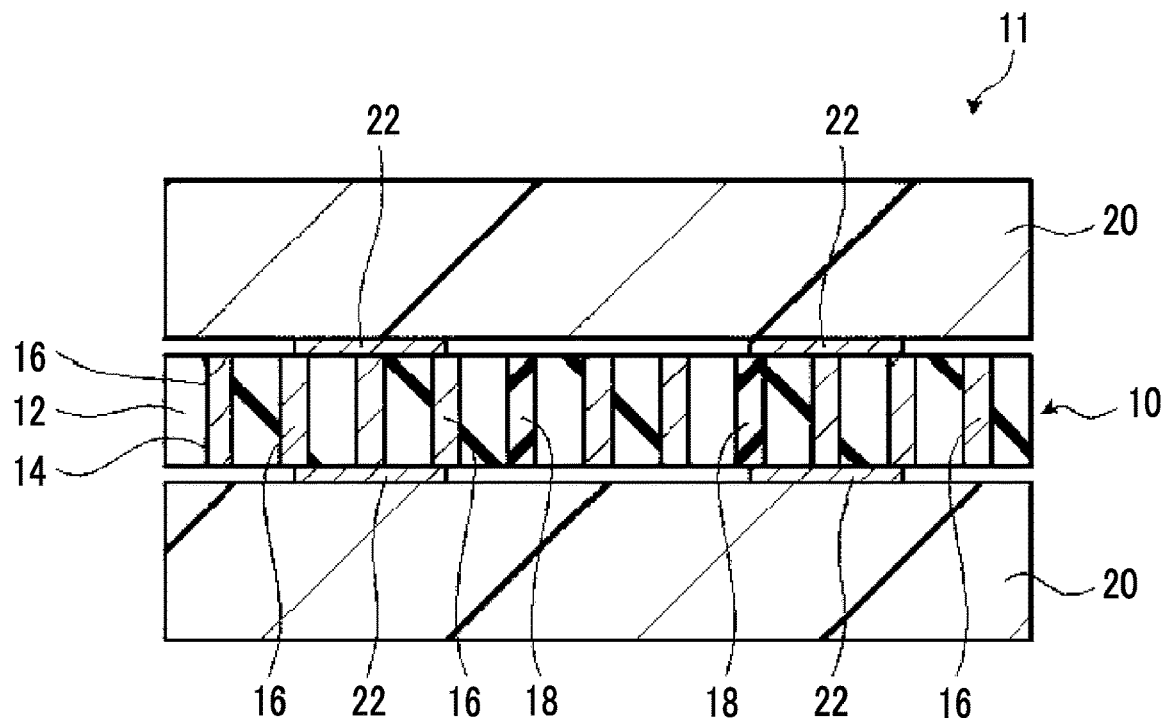
FIG. 3 is a schematic view showing an example of a laminate according to an embodiment of the present invention.
Figure 4:
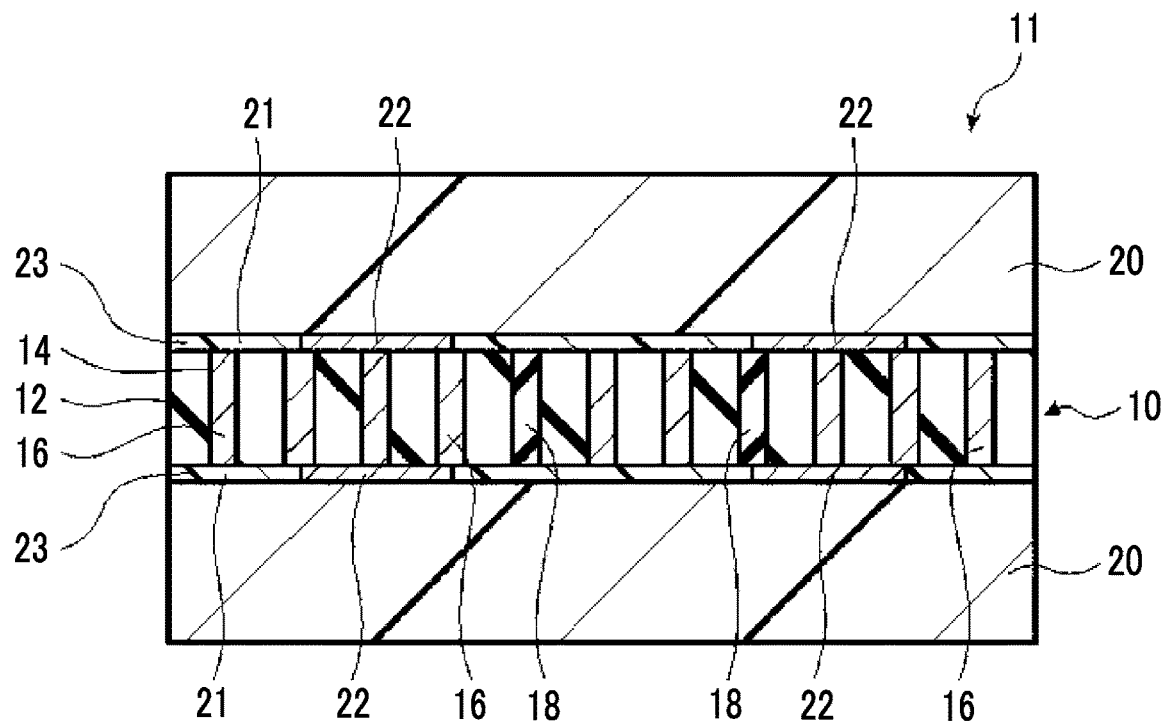
FIG. 4 is a schematic view showing another example of the laminate according to the embodiment of the present invention.

FIG. 3 is a schematic view showing an example of a laminate according to an embodiment of the present invention, and FIG. 4 is a schematic view showing another example of the laminate according to the embodiment of the present invention.

A laminate 11 shown in FIG. 3 has the structure 10, and a wiring substrate 20 having an electrode 22. In the laminate 11, the conductive path 16 of the structure 10 and the electrode 22 are electrically connected.

The configuration of the laminate 11 is not limited to the configuration shown in FIG. 3. As in the laminate 11 shown in FIG. 4, the conductive path 16 of the structure 10 and the electrode 22 may be electrically connected, and a gap 21 between the structure 10 and the wiring substrate 20 may be filled with an insulating material. In this case, an insulating layer 23 is constituted by the insulating material filling the gap 21 between the structure 10 and the wiring substrate 20.

By providing the insulating layer 23, the conductive path 16 of the structure 10 and the electrode 22 are reliably electrically connected and an appropriate electrical signal or the like is input to the electrode 22 to increase a signal-noise ratio (S/N ratio).

The insulating material constituting the insulating layer 23 is not particularly limited as long as the insulating material has electrical insulation, and is constituted of, for example, silicon nitride (SiN), silicon oxide, polyimide, or epoxy resin.

The wiring substrate 20 is not particularly limited as long as the wiring substrate is configured to have the electrode 22, and is, for example, a multilayer wiring substrate or the like.

The laminates 11 shown in FIGS. 3 and 4 are configured to have one structure 10 and two wiring substrates 20, but are not limited thereto. For example, three wiring substrates 20 may be electrically connected using two structures 10.

Figure 5:
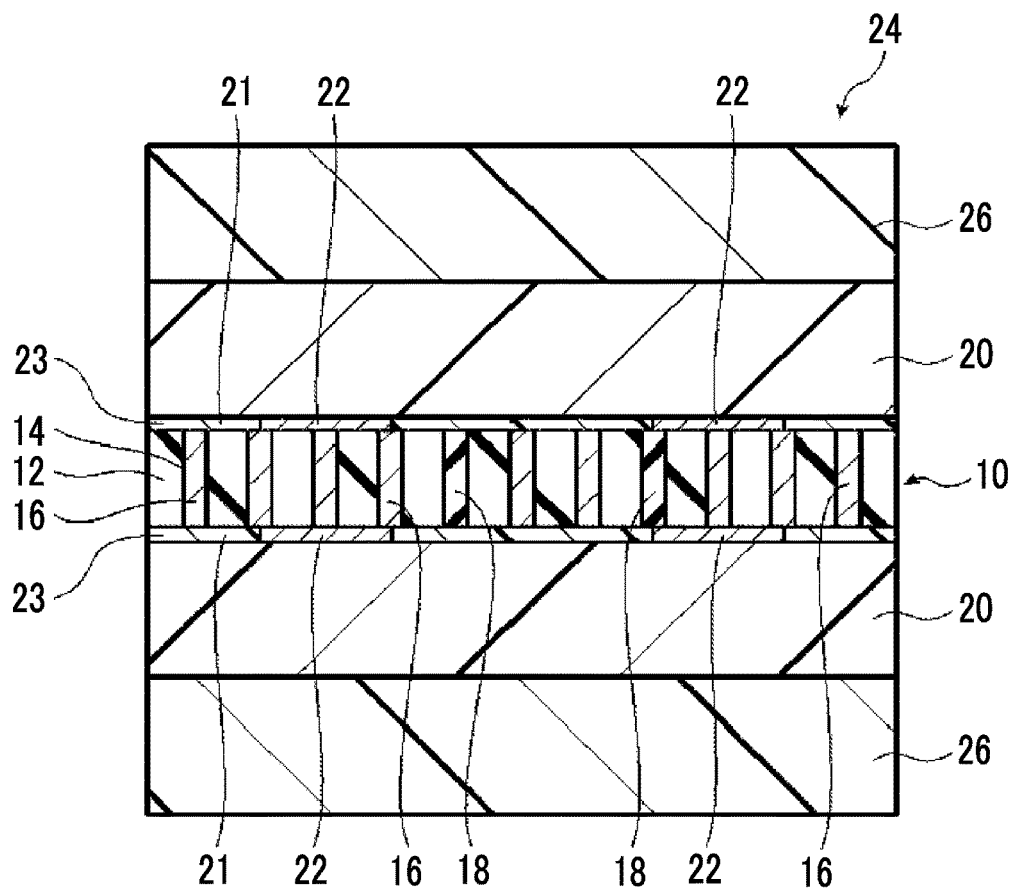
FIG. 5 is a schematic view showing an example of a semiconductor package according to an embodiment of the present invention.

The above-described structure 10 can be used for a semiconductor package 24 shown in FIG. 5. The semiconductor package 24 has the above-described structure 10 and the above-described wiring substrate 20, and a semiconductor element 26 is electrically connected to both surfaces of the wiring substrate 20. The insulating layer 23 is constituted of the insulating material filling the gap 21 between the structure 10 and the wiring substrate 20.

The semiconductor package 24 is, for example, a complete article, and the semiconductor package 24 alone performs a specific function such as a circuit or a sensor.

The semiconductor element used in the semiconductor package 24 is not particularly limited and specific examples thereof are as follows. Examples of the semiconductor element include logic integrated circuits such as an application specific integrated circuit (ASIC), a field programmable gate array (FPGA), and an application specific standard product (ASSP). In addition, examples thereof include microprocessors such as a central processing unit (CPU) and a graphics processing unit (GPU). Examples thereof also include memories such as a dynamic random access memory (DRAM), a hybrid memory cube (HMC), a magnetoresistive random access memory (MRAIVI), a phase-change memory (PCM), a resistance random access memory (ReRAIVI), a ferroelectric random access memory (FeRAM), and a flash memory. In addition, examples thereof include analog integrated circuits such as a light emitting diode (LED), a power device, a direct current (DC)-direct current (DC) connector, and an insulated gate bipolar transistor (IGBT). Examples thereof include micro electro mechanical systems (MEMS) such as an acceleration sensor, a pressure sensor, a vibrator, and a gyro sensor. Examples thereof include wireless elements such as a global positioning system (GPS), frequency modulation (FM), near field communication (NFC), a RF expansion module (RFEM), a monolithic microwave integrated circuit (MMIC), and a wireless local area network (WLAN), discrete elements, complementary metal oxide semiconductors (CMOSs), CMOS image sensors, camera modules, passive devices, surface acoustic wave (SAW) filters, radio frequency (RF) filters, and integrated passive devices (IPDs).

Figure 23:
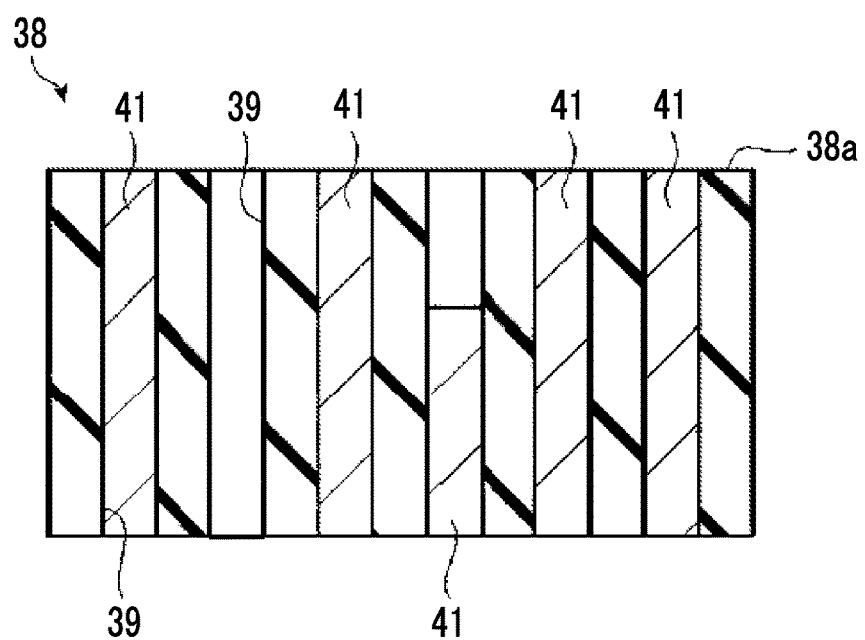
FIG. 23 is a schematic cross-sectional view showing the step of the example of the method for manufacturing a structure according to the embodiment of the present invention.
Figure 24:
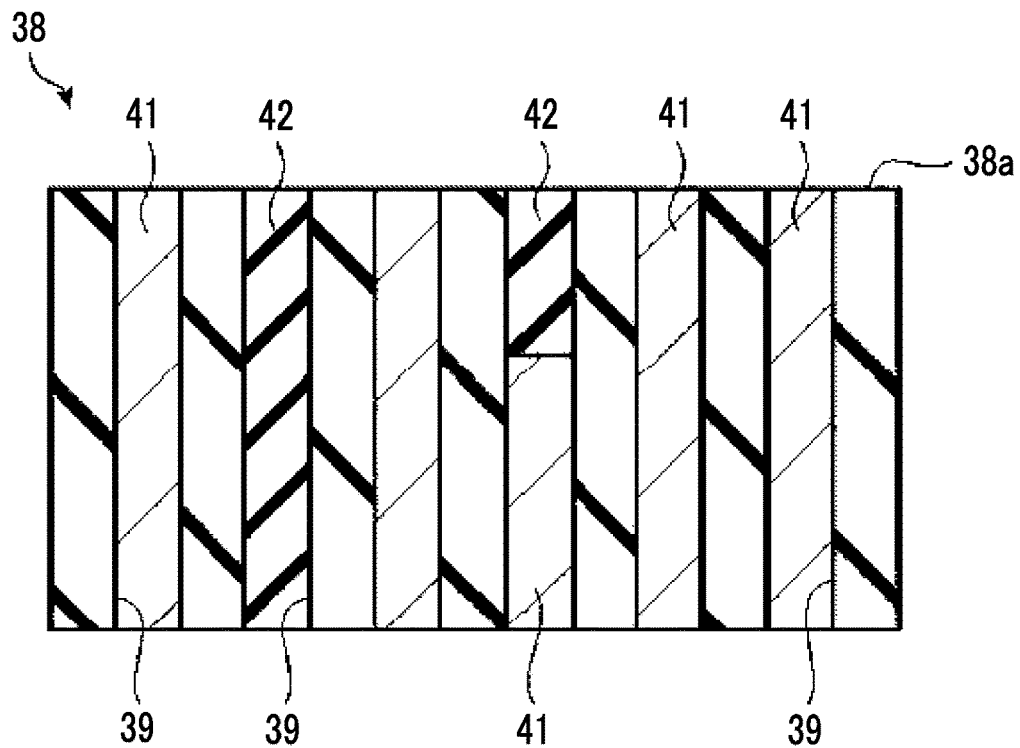
FIG. 24 is a schematic cross-sectional view showing the step of the example of the method for manufacturing a structure according to the embodiment of the present invention.
Figure 25:
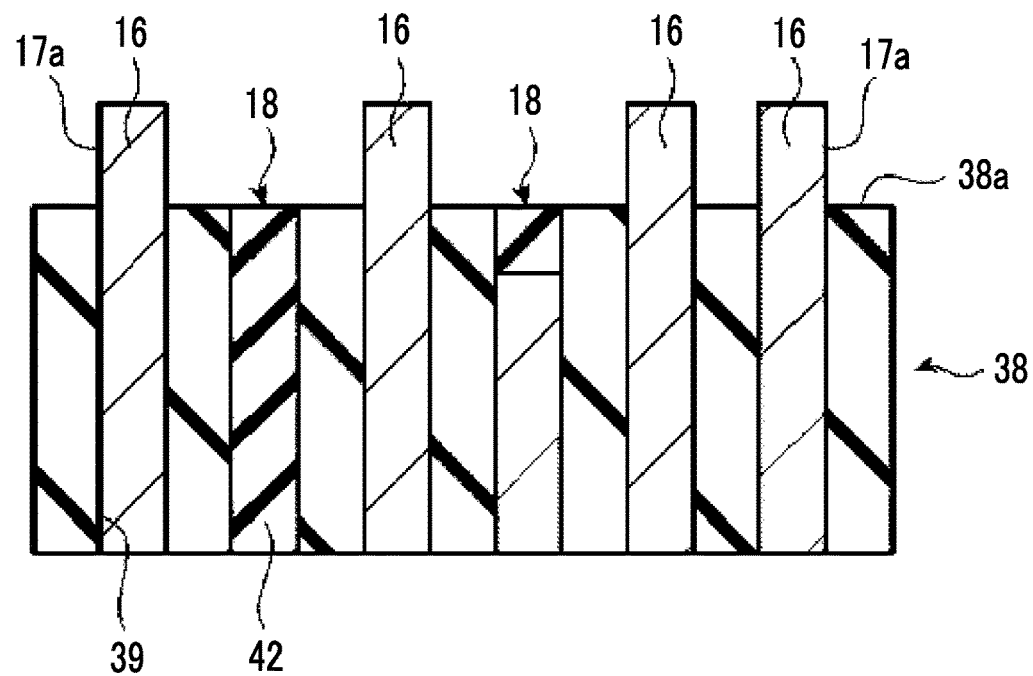
FIG. 25 is a schematic cross-sectional view showing the step of the example of the method for manufacturing a structure according to the embodiment of the present invention.

Next, a method for manufacturing a structure 10 will be described. FIGS. 6 to 22 are schematic views showing a step order of an example of a method for manufacturing a structure according to an embodiment of the present invention. FIGS. 23 to 25 are schematic cross-sectional views showing the step order of the example of the method for manufacturing a structure according to the embodiment of the present invention.

In FIGS. 6 to 25, the same components as those in the structure 10 shown in FIGS. 1 and 2 are given the same reference numerals, and detailed descriptions thereof are omitted.

Figure 6:
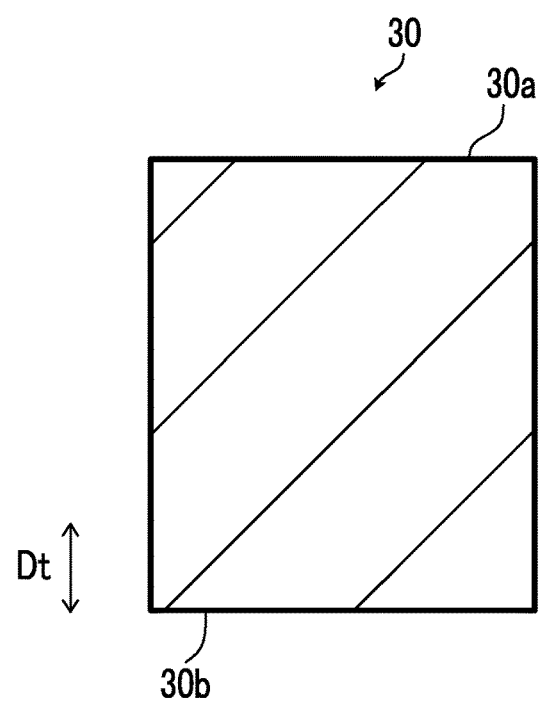
FIG. 6 is a schematic view showing a step of an example of a method for manufacturing a structure according to an embodiment of the present invention.

First, as shown in FIG. 6, for example, an aluminum substrate 30 is prepared. The size and thickness of the aluminum substrate 30 are appropriately determined according to the thickness h (refer to FIG. 1) of the insulating base 12 (refer to FIG. 1) of the finally obtained structure 10 (refer to FIG. 1), a device for processing, and the like. The aluminum substrate 30 is, for example, a rectangular plate. As shown in FIG. 1, as long as the insulating base 12 having the plurality of through-holes 14 can be formed, the present invention is not limited to the aluminum substrate 30.

Figure 7:
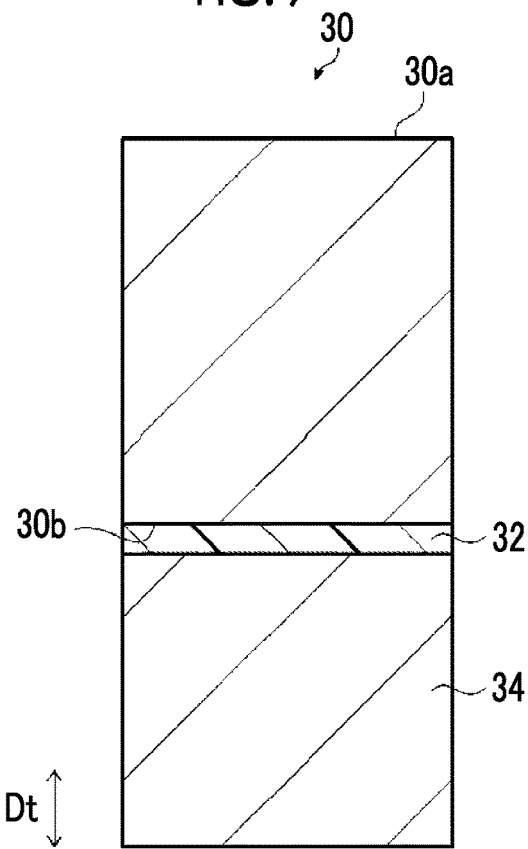
FIG. 7 is a schematic view showing the step of the example of the method for manufacturing a structure according to the embodiment of the present invention.

Next, as shown in FIG. 7, for example, a support member 34 is attached to a rear surface 30b of the aluminum substrate 30 using a double-sided pressure sensitive adhesive 32. For example, the support member 34 has the same outer shape as the shape of the aluminum substrate 30 and functions as a support. By attaching the support member 34 to the aluminum substrate 30, the handleability is increased.

For the support member 34, for example, a silicon substrate is used. For the support member 34, in addition to the silicon substrate, for example, a ceramic substrate such as SiC, SiN, GaN, and alumina ($Al_2O_3$), a glass substrate, a fiber reinforced plastic substrate, and a metal substrate can be used. The fiber reinforced plastic substrate includes a flame retardant type 4 (FR-4) substrate, which is a printed wiring board, and the like.

As long as the double-sided pressure sensitive adhesive 32 can bond the aluminum substrate 30 and the support member 34, the configuration thereof is not particularly limited. For example, a double-sided type REVALPHA (registered trademark) manufactured by Nitto Denko Corporation (registered trademark) can be used.

[Aluminum Substrate]

The aluminum substrate is not particularly limited and specific examples thereof include a pure aluminum substrate; alloy substrates including aluminum as a main component and trace amounts of other elements; substrates made of low purity aluminum (for example, recycled material) on which high purity aluminum is vapor-deposited; substrates such as silicon wafers, quartz, or glass whose surface is covered with high purity aluminum by a method such as vapor deposition or sputtering; and resin substrates on which aluminum is laminated.

Of the aluminum substrate, the purity of aluminum of one surface on which an anodized film is to be formed by an anodizing treatment is preferably 99.5% by mass or higher, more preferably 99.9% by mass or higher, and still more preferably 99.99% by mass or higher. In a case where the purity of aluminum is within the above range, the regularity of micropore arrangement is sufficient.

The aluminum substrate 30 is not particularly limited as long as an anodized film can be formed, and for example, a Japanese industrial standards (JIS) 1050 material may be used.

It is preferable that a front surface 30a on one side of the aluminum substrate 30 subjected to an anodizing treatment (refer to FIGS. 6 and 7) is subjected to a heat treatment, a degreasing treatment, and a mirror finishing treatment in advance.

Here, as the heat treatment, the degreasing treatment, and the mirror finishing treatment, the same treatments as each treatment described in paragraphs "0044" to "0054" of JP2008-270158A can be carried out.

The mirror finishing treatment before the anodizing treatment is, for example, electropolishing, and in the electropolishing, for example, an electropolishing solution containing phosphoric acid is used.

Figure 8:
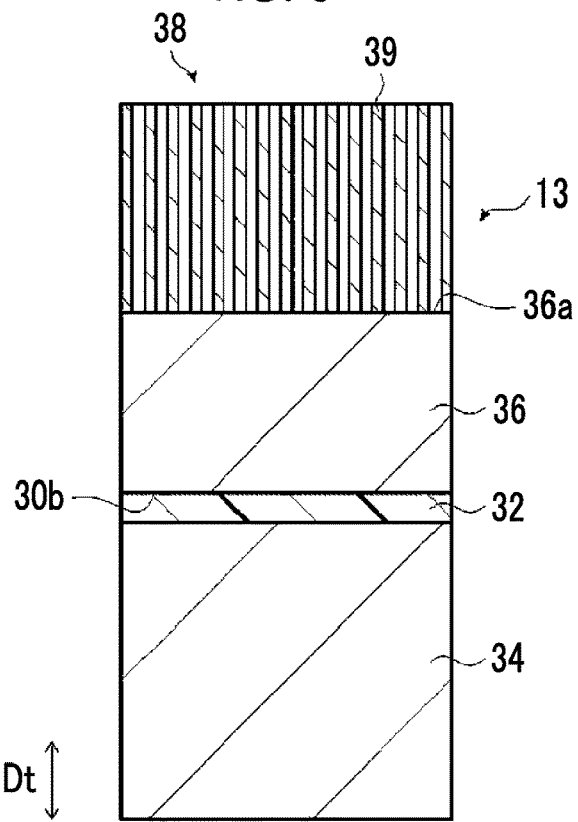
FIG. 8 is a schematic view showing the step of the example of the method for manufacturing a structure according to the embodiment of the present invention.

Next, the front surface 30a on one side of the aluminum substrate 30 (refer to FIG. 7) is subjected to an anodizing treatment. Thus, the front surface 30a on one side of the aluminum substrate 30 (refer to FIG. 7) is anodized and as shown in FIG. 8, an insulating structure 13 including an aluminum base 36 and an anodized film 38 having a plurality of micropores 39 extending in the thickness direction Dt of the aluminum base 36 in a front surface 36a of the aluminum base 36 is formed. The step of forming this insulating structure 13 corresponds to a first step. The above-described anodizing step is also called an anodizing treatment step. The micropore 39 is the through-hole 14 shown in FIG. 1.

[Anodizing Treatment Step]

The anodizing treatment can be carried out using conventionally known methods but from the viewpoint of increasing regularity of micropore arrangement and securing anisotropic conductivity of a metal filled microstructure, a self-regulation method and a constant voltage treatment are preferably used.

Here, regarding the self-regulation method and the constant voltage treatment of the anodizing treatment, the same treatments as each of the treatments described in paragraphs <0056> to <0108> and [FIG. 3] of JP2008-270158A can be carried out.

In the anodized film 38 having the plurality of micropores 39, a barrier layer (not shown) is present on the bottom of the micropores 39. A barrier layer removal step of removing this barrier layer is provided.

[Barrier Layer Removal Step]

Figure 9:
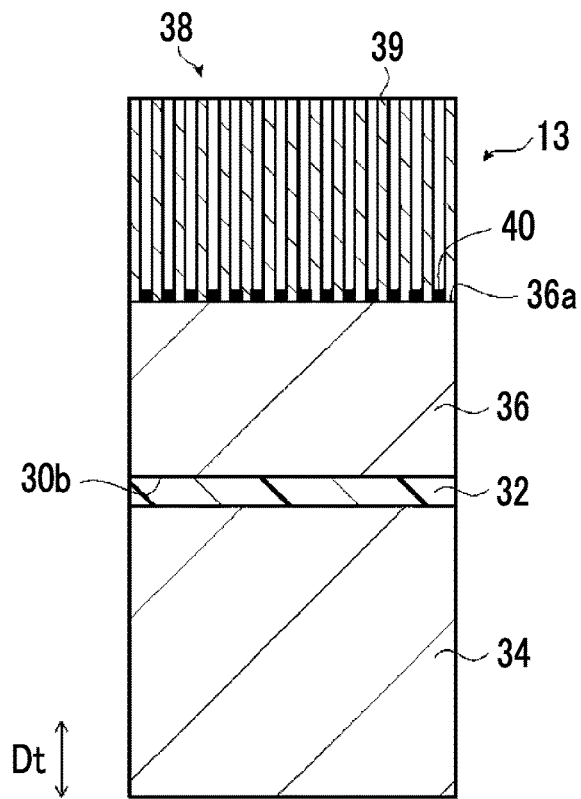
FIG. 9 is a schematic view showing the step of the example of the method for manufacturing a structure according to the embodiment of the present invention.

After the anodizing treatment, for example, the barrier layer of the anodized film 38 is removed using an aqueous alkaline solution including a metal having higher hydrogen overvoltage than that of aluminum. By removing the barrier layer, as shown in FIG. 9, a metal layer 40 formed of a metal having higher hydrogen overvoltage than that of aluminum is formed on the bottom of the micropores 39.

Here, the hydrogen overvoltage refers to a voltage required for generating hydrogen and for example, the hydrogen overvoltage of aluminum (Al) is −1.66 V (Journal of the Chemical Society of Japan: chemistry and industrial chemistry 1982, (8), p. 1305-1313). Examples of the metal having hydrogen overvoltage higher than the hydrogen overvoltage of aluminum, and the hydrogen overvoltage values thereof are shown below.

Figure 10:
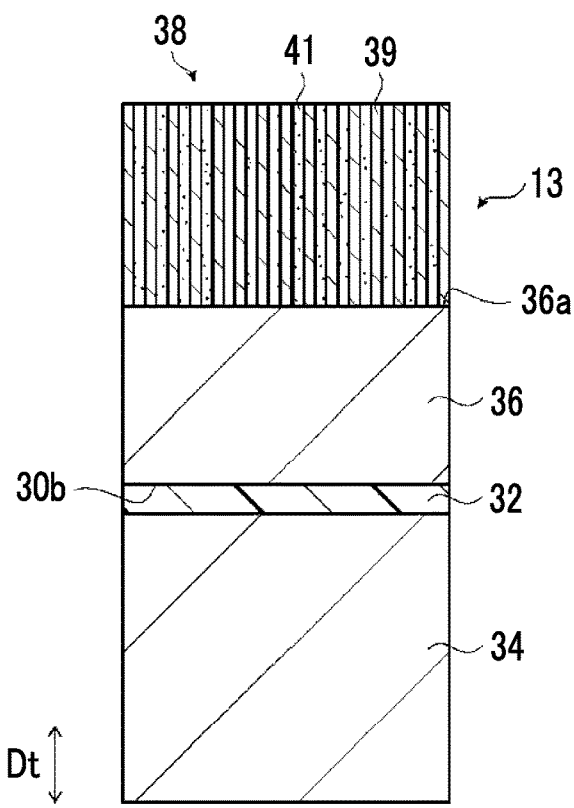
FIG. 10 is a schematic view showing the step of the example of the method for manufacturing a structure according to the embodiment of the present invention.

<Metals and Hydrogen (1N $H_2SO_4$) Overvoltage>
Platinum (Pt): 0.00 V
Gold (Au): 0.02 V
Silver (Ag): 0.08 V
Nickel (Ni): 0.21 V
Copper (Cu): 0.23 V
Tin (Sn): 0.53 V
Zinc (Zn): 0.70 V Next, as shown in FIGS. 10 and 23, for example, in the insulating structure 13, the micropores 39 of the anodized film 38 are filled with a metal as a conductive substance 41. The conductive substance 41 filling the micropores 39 is not limited to the metal. The filling of the micropores 39 with the metal also refers to a metal filling step, and for example, an electrolytic plating treatment is used. However, the filling of the metal which is an example of the conductive substance will be described in detail later.

The step of filling the micropores 39 with the metal corresponds to a second step.

[Metal Filling Step]

<Filling Metal>

The metal filling the above-described micropores 39 as a conductive substance is preferably a material having an electrical resistivity of $10^3$ Ω·cm or less and specific suitable examples thereof include gold (Au), silver (Ag), copper (Cu), aluminum (Al), magnesium (Mg), nickel (Ni), and zinc (Zn). As the conductive substance, in addition to the above-described metals, tin oxides doped with indium (ITO) and the like are suitably used.

As the conductive substance, from the viewpoint of electrical conductivity, Cu, Au, Al, and Ni are preferable, Cu and Au are more preferable, and Cu is still more preferable.

<Metal Filling Method>

As an electrolytic plating treatment method for filling the micropores with the metal, for example, an electrolytic plating method or an electroless plating method can be used.

Here, in the conventionally known electrolytic plating method used for coloring or the like, it is difficult to selectively deposit (grow) a metal in pores at a high aspect. This is considered that this is because the precipitated metal is consumed in the pores and the plating does not grow even in a case where electrolysis is performed for a predetermined period of time or longer.

Therefore, when the metal is filled by the electrolytic plating method, it is necessary to provide a pause time during pulse electrolysis or constant potential electrolysis. The pause time is required to be 10 seconds or longer and is preferably 30 to 60 seconds.

In addition, it is also desirable to add ultrasonic waves to promote stirring of the electrolytic solution.

Further, the electrolysis voltage is usually 20 V or less, preferably 10 V or less. However, it is preferable to measure the deposition potential of the target metal in the electrolytic solution to be used in advance and perform constant potential electrolysis within the potential+1 V. In a case of performing constant potential electrolysis, it is desirable to use a cyclic voltammetry in combination, and potentiostat devices manufactured by Solartron Metrology, BAS Inc., Hokuto Denko Corporation, IVIUM Technologies, and the like can be used.

As the plating solution, conventionally known plating solutions can be used.

Specifically, in a case where copper is deposited, a copper sulfate aqueous solution may be generally used. However, the concentration of copper sulfate is preferably 1 to 300 g/L, and more preferably 100 to 200 g/L. In addition, deposition can be promoted by adding hydrochloric acid to the electrolytic solution. In this case, the hydrochloric acid concentration is preferably 10 to 20 g/L.

In addition, in a case where gold is deposited, it is desirable to perform plating by alternating current electrolysis using a sulfuric acid solution of tetrachloro gold.

In the electroless plating method, it takes a long time to completely fill pores formed of micropores with a high aspect with a metal, and thus it is desirable to fill the micropores with the metal by the electrolytic plating method.

Figure 11:
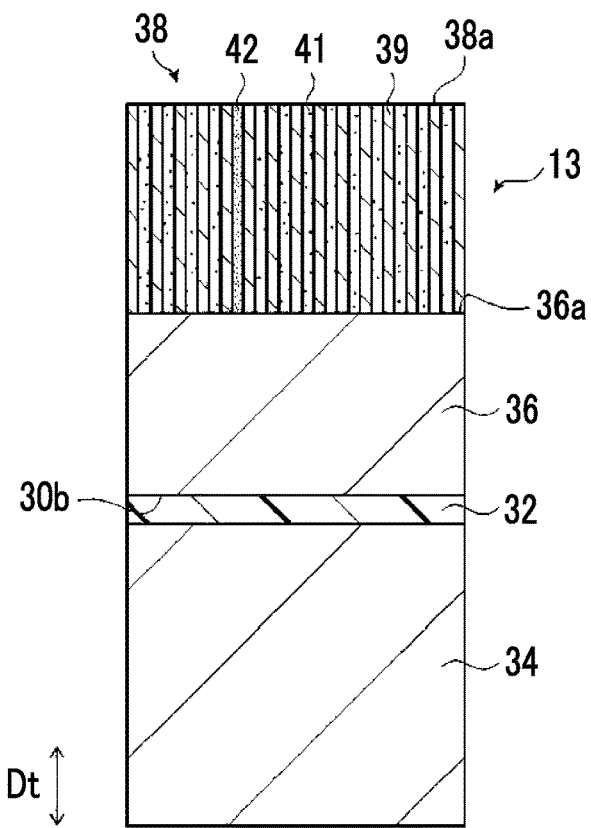
FIG. 11 is a schematic view showing the step of the example of the method for manufacturing a structure according to the embodiment of the present invention.

As shown in FIG. 23, the plurality of micropores 39 are partially filled with the conductive substance 41. Next, as shown in FIGS. 11 and 24, the micropores 39 of the anodized film 38 are filled with an insulating substance 42.

In this manner, the step of filling a region not filled with the conductive substance 41 with the insulating substance 42 among the plurality of micropores 39 corresponds to a third step.

In the state shown in FIG. 24 as it is, in a case where the micropores 39 not filled with the conductive substance 41 are not filled with the insulating substance 42, the surrounding conductive paths 16 collapse toward unfilled micropores 39 not filled with the insulating substance 42 and adjacent conductive paths 16 come into contact with each other.

[Insulating Substance Filling Step]

<Filling Insulating Substance>

For example, the insulating substance filling the above-described micropores 39 is at least one selected from the group consisting of aluminum hydroxide, silicon dioxide, metal alkoxide, lithium chloride, titanium oxide, magnesium oxide, tantalum oxide, niobium oxide, and zirconium oxide.

Among these, for the reason of excellent insulating properties, aluminum hydroxide, silicon dioxide, metal alkoxide, and lithium chloride are preferable, and in a case where the above-described insulating base is an anodized film of aluminum, aluminum hydroxide is particularly preferable for the reason of excellent adsorptivity with aluminum oxide.

Here, specific examples of the metal alkoxide mentioned above include those exemplified in a sealing treatment (sol-gel method) described later.

In addition to the above-described insulating substances, as the insulating substance, for example, ionomers such as polyethylene, polypropylene, poly-4-methylpentene, and ethylene-based ionomers, thermoplastic elastomers such as polyvinyl chloride, polyvinylidene chloride, vinyl acetate resin, acrylonitrile butadiene styrene (ABS copolymer) resin, polystyrene resin, styrene acrylonitrile (AS) copolymer resin, methacrylic resin, polyvinyl alcohol, ethylene vinyl acetate (EVA) copolymer resin, cellulose-based plastic, polystyrene-based, and polyolefin-based, polyvinyl chloride-based, polyurethane-based, polyester-based, and polyamide-based thermoplastic elastomers, epoxy resin, unsaturated polyester resin, phenol resin, urea melamine resin, polyurethane resin, silicone resin, polyacryl resin, polyamide resin, polyacetal, polycarbonate, modified polyphenylene ether, thermoplastic polyester resin, polytetrafluoroethylene, fluororesin, polyphenylene sulfide, polysulfone, amorphous polyarylate, polyetherimide, polyethersulfone, polyetherketone, liquid crystal polyester, polyamideimide, polyimide, other super engineering plastic resins, polymer alloys, and combinations of two or more of these substances can be used.

<Insulating Substance Filling Method>

Further, after the above-described metal filling step, an insulating substance filling step of filling the micropores not filled with the conductive substance with an insulating substance in the anodized film is performed.

The insulating substance filling step can be performed according to known methods such as coating treatment, immersion treatment, vapor deposition treatment, boiling water treatment, hot water treatment, steam treatment, sodium silicate treatment, nitrite treatment, and ammonium acetate treatment. The insulating substance filling step may be performed using, for example, the devices and methods described in JP1981-012518B (JP-S56-012518B), JP1992-004194A (JP-H04-004194A), JP1993-202496A (JP-H05-202496A), and JP1993-179482A (JP-H05-179482A).

The treatment liquid used in boiling water treatment, hot water treatment, sodium silicate treatment, and the like is allowed to penetrate the micropores 39 not filled with the metal and the substance constituting the inner wall of the micropores 39, such as aluminum oxide or the like, is altered into aluminum hydroxide or the like, thereby to achieve sealing of the through-holes.

Other suitable examples of the sealing treatment of sealing the through-holes include a sealing treatment using a sol-gel method as described in paragraphs <0016> to <0035> of JP1994-035174A (JP-H06-035174A).

The sol-gel method is generally a method in which a sol formed of metal alkoxide is altered into a gel, which has no fluidity, through hydrolysis and polycondensation reaction, and the gel is then heated to form an oxide.

The metal alkoxide is not particularly limited and, from a viewpoint of ease with which the micropores 39 are sealed, suitable examples thereof include $Al(O—R)n$, $Ba(O—R)n$, $B(O—R)n$, $Bi(O—R)n$, $Ca(O—R)n$, $Fe(O—R)n$, $Ga(O—R)n$, $Ge(O—R)n$, $Hf(O—R)n$, $In(O—R)n$, $K(O—R)n$, $La(O—R)n$, $Li(O—R)n$, $Mg(O—R)n$, $Mo(O—R)n$, $Na(O—R)n$, $Nb(O—R)n$, $Pb(O—R)n$, $Po(O—R)n$, $Po(O—R)n$, $P(O—R)n$, $Sb(O—R)n$, $Si(O—R)n$, $Sn(O—R)n$, $Sr(O—R)n$, $Ta(O—R)n$, $Ti(O—R)n$, $V(O—R)n$, $W(O—R)n$, $Y(O—R)n$, $Zn(O—R)n$, and $Zr(O—R)n$. Among the above examples, R represents a linear, branched, or cyclic hydrocarbon group that may have a substituent or a hydrogen atom, and n represents any natural number.

Among the above examples, in a case where the insulating base is an anodized film of aluminum, titanium oxide or silicon oxide-based metal alkoxide is preferably used for their excellent reactivity with aluminum oxide and excellent sol-gel forming capability.

Although the method of forming a sol-gel in the micropores 39 is not particularly limited, from a viewpoint of ease with which filling into the micropores 39 for sealing, a method in which a sol-gel liquid is applied and heated is preferably used.

The concentration of the sol-gel liquid is preferably 0.1% to 90% by mass, more preferably 1% to 80% by mass, and most preferably 5% to 70% by mass.

In addition, in order to increase the pore sealing ratio, the treatments may be repeated.

In an alternative sealing treatment, the through-holes may be filled with insulating particles with a size that can enter the micropores 39. Such insulating particles are preferably formed of colloidal silica from the viewpoint of its dispersibility and size.

Colloidal silica may be prepared by a sol-gel method and then used, or commercially available products can be used. In a case where colloidal silica is prepared by a sol-gel method, for example, to Werner Stober et al; J. Colloid and Interface Sci., 26, 62-69 (1968), Rickey D. Badley et al; Lang muir 6, 792-801 (1990), Journal Of The Japan Society Of Colour Material, 61 [9] 488-493 (1988) can be referred to.

The colloidal silica is a dispersion of silica formed of silicon dioxide as a basic unit in water or a water-soluble solvent. The particle diameter thereof is preferably 1 nm to 400 nm, more preferably 1 nm to 100 nm, and most preferably 5 nm to 50 nm. In a case where the particle diameter is smaller than 1 nm, the storage stability of the coating solution is poor and in a case where the particle diameter is larger than 400 nm, the filling properties to the micropores 39 are poor.

The colloidal silica having a particle diameter in the above range is in a state of aqueous dispersion liquid and may be used whether the colloidal silica is basic or acidic. The colloidal silica can be selected appropriately according to the stability range of the aqueous dispersion to be mixed.

Examples of acid colloidal silica of which the dispersive medium is water which may be used herein include commercially available products such as SNOWTEX (registered trademark; the same applies below)-O and SNOWTEX-OL manufactured by Nissan Chemical Industries, Ltd., ADELITE (registered trademark; the same applies below) AT-20Q, manufactured by ADEKA Corporation, and KLEBOSOL (registered trademark; the same applies below) 20H12 and KLEBOSOL 30CAL25 manufactured by Clariant (Japan) K.K.

As the basic colloidal silica, silica that gains stability by adding alkali metal ion, ammonium ion, or amine, and for example, commercially available products such as SNOWTEX-20, SNOWTEX-30, SNOWTEX-C, SNOWTEX-C30, SNOWTEX-CM40, SNOWTEX-N, SNOWTEX-N30, SNOWTEX-K, SNOWTEX-XL, SNOWTEX-YL, SNOWTEX-ZL, SNOWTEX PS-M, and SNOWTEX PS-L manufactured by Nissan Chemical Industries, Ltd.; ADELITE AT-20, ADELITE AT-30, ADELITE AT-20N, ADELITE AT-30N, ADELITE AT-20A, ADELITE AT-30A, ADELITE AT-40, and ADELITE AT-50 manufactured by ADEKA Corporation; KLEBOSOL 30R9, KLEBOSOL 30R50, KLEBOSOL 50100 manufactured by Clariant (Japan) K.K.; and LUDOX (registered trademark: the same applies below) HS-40, LUDOX HS-30, LUDOX LS, and LUDOX SM-30 manufactured by E.I. du Pont de Nemours and Company can be used.

As colloidal silica of which the dispersive medium is a water-soluble solvent which may be used herein, commercially available products such as MA-ST-M (particle diameter: 20 to 25 nm, methanol-dispersed type), IPA-ST (particle diameter: 10 to 15 nm, isopropyl alcohol-dispersed type), EG-ST (particle diameter: 10 to 15 nm, ethylene glycol-dispersed type), EG-ST-ZL (particle diameter: 70 to 100 nm, ethylene glycol-dispersed type), NPC-ST (particle diameter: 10 to 15 nm, ethylene glycol monopropyl ether-dispersed type) manufactured by Nissan Chemical Industries, Ltd. can be used.

These colloidal silicas may be used alone or in combination of two or more thereof and may contain a trace amount of, for example, alumina or sodium aluminate.

Further, colloidal silica may contain, for example, an inorganic base such as sodium hydroxide, potassium hydroxide, lithium hydroxide, or ammonia) and an organic base such as tetramethyl ammonium, as a stabilizer.

In the above-described insulating substance filling step, in a case of sealing the above-described micropores, the surface of the insulating base may be covered by the above-described insulating substance. However, in this case, in a case where most of the above-described micropores function as the conductive paths of the anisotropic conductive member, it is preferable to remove the above-described insulating substance covering the surface of the above-described insulating base.

Here, the method of removing the above-described insulating substance covering the surface of the above-described insulating base is not particularly limited, and for example, a method of removing only the surface layer portion of the insulating base by, in addition to mechanical polishing treatment, chemical-mechanical polishing treatment, enzyme plasma treatment, or immersion treatment using, for example, an aqueous alkaline solution such as sodium hydroxide aqueous solution and an aqueous acid solution such as sulfuric acid can be suitably used.

Figure 12:
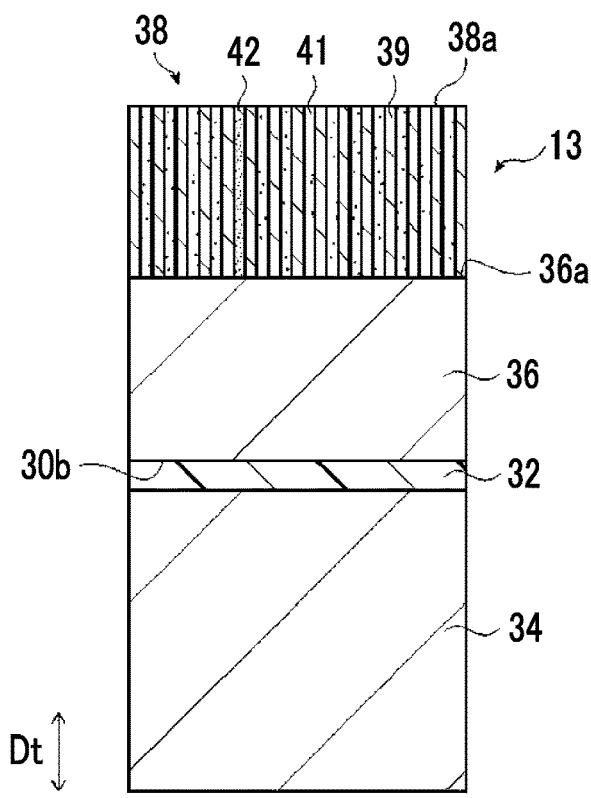
FIG. 12 is a schematic view showing the step of the example of the method for manufacturing a structure according to the embodiment of the present invention.

Next, a front surface 38a of the anodized film 38 shown in FIG. 11 is polished and as shown in FIG. 12, the film thickness of the anodized film 38 is reduced. In this case, the support member 34 is used as a support, and the front surface 38*a* of the anodized film 38 is polished. For polishing, for example, chemical mechanical polishing, ion milling and electropolishing treatment are used.

Figure 13:
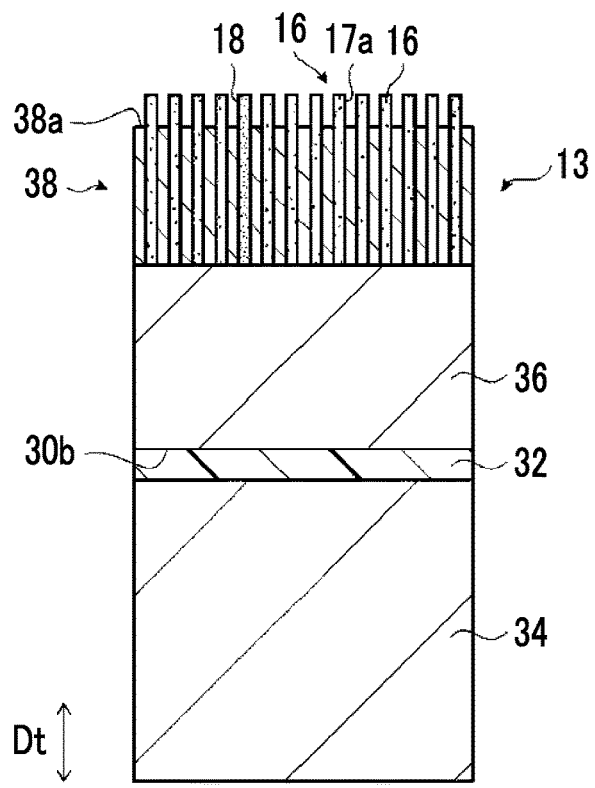
FIG. 13 is a schematic view showing the step of the example of the method for manufacturing a structure according to the embodiment of the present invention.

Next, the front surface 38*a* of the anodized film 38 is partially removed in the thickness direction Dt and as shown in FIGS. 13 and 25, the above-described filled metal is caused to protrude from the front surface 38*a* of the anodized film 38. That is, the conductive path 16 is caused to protrude from the front surface 38*a* of the anodized film 38. In this case, in a case of removing the anodized film 38, it is preferable to remove the anodized film 38 and the insulating substance 42 at the same time by, for example, etching. The step of removing the anodized film 38 and the insulating substance 42 by, for example, etching corresponds to a fourth step.

Further, the step of causing the metal filling the micropores 39 to protrude from the front surface 38*a* of the anodized film 38 corresponds to the fourth step. The above-described step of causing the metal to protrude from the front surface of the anodized film is referred to as a trimming step.

[Trimming Step]

Before the trimming step, a step of forming the anodized film 38 into a specific shape may be provided. In this case, for example, the anodized film 38 is formed into a specific shape using a Thomson blade.

The etching in the trimming step is not particularly limited as long as the anodized film 38 is removed and the metal constituting the conductive path is not dissolved, and for example, in a case of using an aqueous acid solution, it is preferable to use an aqueous solution of an inorganic acid such as sulfuric acid, phosphoric acid, nitric acid, or hydrochloric acid, or a mixture thereof. Among these, an aqueous solution that does not contain chromic acid is preferable from the viewpoint of excellent safety. The concentration of the aqueous acid solution is preferably 1% by mass to 10% by mass. The temperature of the aqueous acid solution is preferably 25° C. to 60° C.

On the other hand, in a case of using an aqueous alkaline solution, it is preferable to use an aqueous alkaline solution of at least one selected from the group consisting of sodium hydroxide, potassium hydroxide, and lithium hydroxide. The concentration of the aqueous alkaline solution is preferably 0.1% by mass to 5% by mass. The temperature of the aqueous alkaline solution is preferably 20° C. to 50° C.

Specifically, for example, a 40° C. aqueous solution containing 50 g/L of phosphoric acid, a 30° C. aqueous solution containing 0.5 g/L of sodium hydroxide, or a 30° C. aqueous solution containing 0.5 g/L of potassium hydroxide is suitably used.

The immersion time in the aqueous acid solution or aqueous alkaline solution is preferably 8 minutes to 120 minutes, more preferably 10 minutes to 90 minutes, and still more preferably 15 minutes to 60 minutes. Here, the immersion time refers to the total of each immersion time in a case where a short period of time of immersion treatment (trimming treatment) is repeated. A washing treatment may be carried out between each immersion treatment.

In addition, in a case where the structure 10 is used as an anisotropic conductive member, for reasons of good pressure bonding properties with an adherend such as a wiring substrate or the like, the length of the metal protruding from the front surface 38*a* of the anodized film 38 is preferably 10 nm to 1,000 nm and more preferably 50 nm to 500 nm from the front surface 38*a* of the anodized film 38. That is, the protrusion length of the protrusion 17*a* is preferably 10 nm to 1,000 nm and more preferably 50 nm to 500 nm.

In the trimming step, in a case of strictly controlling the height of the protrusions of the conductive paths, it is preferable to process the insulating base and the end portions of the conductive paths in the same plane after the metal filling and the insulating substance filling into the anodized film 38, and then selectively remove the insulating base.

Here, for example, the method of processing in the same plane includes physical polishing (for example, free abrasive polishing, back grinding, polishing using a surface planer, or the like), electrochemical polishing, polishing of combining these polishing processes, and the like.

Further, after the metal filling and the insulating substance filling into the anodized film 38, or after the trimming step, in order to reduce the strain in the micropores generated by the metal filling and the insulating substance filling, the anodized film can be subjected to a heating treatment.

From the viewpoint of preventing oxidation of the metal, it is preferable to carry out a heating treatment in a reducing atmosphere. Specifically, a heating treatment is preferably carried out at an oxygen concentration of 20 Pa or less and more preferably carried out in vacuum. The term "vacuum" used herein refers to a state of a space with a gas density or pressure lower than the gas density or pressure of air.

In addition, it is preferable to carry out a heating treatment while applying pressure to the anodized film for the purpose of correction.

In the trimming step, it is preferable that the insulating base and the insulating substance are etched at the same time from the viewpoint of ease of processing and shortening of manufacturing time.

After the trimming step, it is preferable to provide a washing step of washing the insulating base.

[Step of Controlling Protrusion Height of Insulating Filling Portion]

Between the above-described insulating substance filling step and the washing step described later, a step of controlling the protrusion height of an insulating filling portion is further provided. As the step of controlling the protrusion height of the insulating filling portion, for example, a step of immersing the anodized film 38 in a liquid in which the insulating substance 42 is dissolved for a predetermined period of time may be adopted.

[Washing Step]

The washing step is a step of, after the trimming step, bringing the insulating base into contact with a liquid by immersion or the like and then drying the liquid.

The washing step includes, for example, a step of bringing the insulating base into contact with a liquid with a surface tension of 30 mN/m or less and a step of drying the liquid. By using a liquid with a surface tension of 30 mN/m or less in the washing step, a capillary force applied to the protrusions of the conductive paths at the time of washing can be reduced. Thus, contact between the protrusions of adjacent conductive paths can be suppressed and the contact rate can be reduced.

Examples of the liquid with a surface tension of 30 mN/m or less include methyl ethyl ketone (MEK), 1-hexanol, 2-hexanone, 3-hexanone, toluene, hexane, methanol, ethanol, 1-propanol, 2-propanol (IPA), acetone, ethyl acetate, butyl acetate, propylene glycol 1-monomethyl ether 2-acetate (PGMEA), and propylene glycol monomethyl ether (PGME), cyclohexane. In addition, a liquid having a surface tension of 30 mN/m or less prepared by mixing a compound having a surface tension of 30 mN/m or less and a compound having a surface tension of 30 mN/m or less may be used.

In addition, the washing step may include a step of immersing the insulating base in a supercritical fluid. The step of immersing the insulating base in a supercritical fluid may be performed before or after the step of bringing the insulating base into contact with a liquid with a surface tension of 30 mN/m or less. For the step of immersing the insulating base in a supercritical fluid, in a state in which the insulating base is immersed in a liquid that is not a supercritical fluid, the temperature and pressure of the liquid may be changed to attain a supercritical state so as to obtain a supercritical fluid.

In a case of using a supercritical fluid, as in the case of using the liquid with a surface tension of 30 mN/m or less, contact between the protrusions of adjacent conductive paths can be suppressed and the contact rate can be reduced.

The supercritical fluid is not particularly limited, and for example, a supercritical fluid of carbon dioxide ($CO_2$), methane, ethane, propane, ethylene, propylene, methanol, ethanol, acetone, or water is used.

Figure 14:
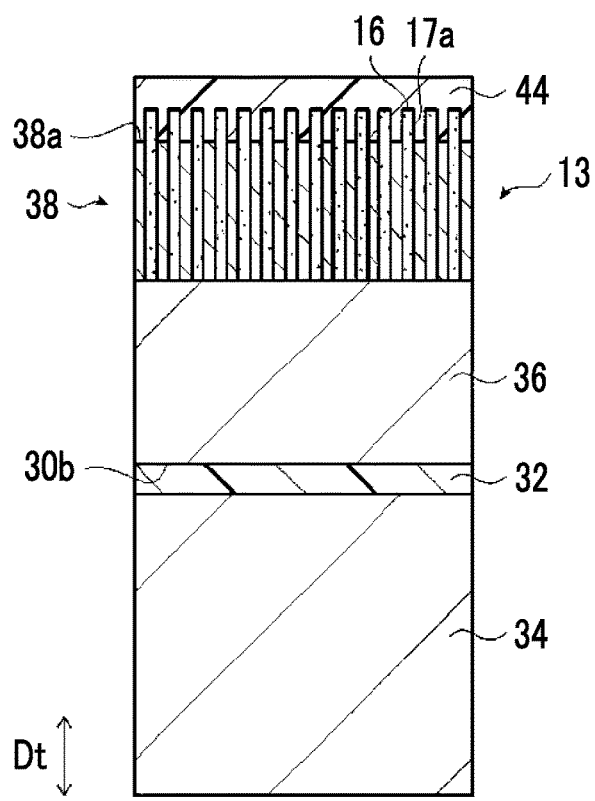
FIG. 14 is a schematic view showing the step of the example of the method for manufacturing a structure according to the embodiment of the present invention.

Since the filled metal protrudes from the front surface 38a of the anodized film 38 as shown in FIG. 13, it is preferable to protect the protruding metal, that is, the protrusion 17a of the conductive path 16. Therefore, as shown in FIG. 14, it is preferable to form a resin layer 44 in which the protrusion 17a of the conductive path 16 is embedded on the front surface 38a of the anodized film 38.

Since the protrusion 17a of the conductive path 16 is protected by the resin layer 44, the transportability of the anodized film 38 can be further improved and handling becomes easier.

The resin layer 44 can be formed using, for example, a conventionally known surface protection tape attaching device and a laminator.

[Resin Layer Forming Step]

Specific examples of resin materials constituting the resin layer 44 include an ethylene-based copolymer, a polyamide resin, a polyester resin, a polyurethane resin, a polyolefin-based resin, an acrylic resin, and a cellulose-based resin, but from the viewpoints of transportability and facilitating use as an anisotropic conductive member, the above-mentioned resin layer is preferably a peelable film with a pressure sensitive adhesive layer, and is more preferably a film with a pressure sensitive adhesive layer that can be peeled by weakening the pressure sensitive adhesiveness by a heating treatment or an ultraviolet exposure treatment.

The above-described film with a pressure sensitive adhesive layer is not particularly limited and examples thereof include a thermally peelable type resin layer and an ultraviolet (UV) peelable type resin layer.

Here, the thermally peelable type resin layer exhibits pressure sensitive adhesiveness at normal temperature and can be easily peeled off simply by heating. Thus, there are many products mainly using foaming microcapsules.

Specific examples of the pressure sensitive adhesive constituting the pressure sensitive adhesive layer include a rubber-based pressure sensitive adhesive, an acrylic pressure sensitive adhesive, a vinyl alkyl ether-based pressure sensitive adhesive, a silicone-based pressure sensitive adhesive, a polyester-based pressure sensitive adhesive, and a polyamide-based pressure sensitive adhesive, an urethane-based pressure sensitive adhesive, and a styrene-diene block copolymer pressure sensitive adhesive.

Also, the ultraviolet (UV) peelable type resin layer has a UV curable type adhesive layer, and loses the pressure sensitive adhesiveness by curing so that the resin layer can be peeled off.

Examples of the UV curable type adhesive layer include polymers with carbon-carbon double bonds introduced into the polymer side chain or in the main chain or at the end of the main chain of the base polymer. As a base polymer having a carbon-carbon double bond, an acrylic polymer is preferable as a basic skeleton.

Further, since the acrylic polymer is crosslinked, a polyfunctional monomer or the like can be included as a monomer component for copolymerization as necessary.

The base polymer having a carbon-carbon double bond can be used alone, but a UV curable type monomer or oligomer can be formulated.

The UV curable type adhesive layer is preferably used in combination with a photopolymerization initiator in order to be cured by UV irradiation. Examples of photopolymerization initiators include benzoin ether-based compounds; ketal-based compounds; aromatic sulfonyl chloride-based compounds; photoactive oxime-based compounds; benzophenone-based compounds; thioxanthones-based compounds; camphorquinones; halogenated ketones; acyl phosphinoxides; and acyl phosphonates.

Examples of commercially available products of the thermally peelable type resin layer include INTELIMER [registered trademark] tapes such as WS5130C02 and WS5130C10 (manufactured by Nitta Corporation); SOMATAC [registered trademark] TE series (manufactured by Somar Corp.); RIBAALPHA [registered trademark] series such as No. 3198, No. 3198LS, No. 3198M, No. 3198MS, No. 3198H, No. 3195, No. 3196, No. 3195M, No. 3195MS, No. 3195H, No. 3195HS, No. 3195V, No. 3195VS, No. 319Y-4L, No. 319Y-4LS, No. 319Y-4M, No. 319Y-4MS, No. 319Y-4H, No. 319Y-4HS, No. 319Y-4LSC, No. 31935MS, No. 31935HS, No. 3193M, and No. 3193MS (manufactured by Nitto Denko Corporation).

As commercially available products of the UV peelable type resin layer, dicing tapes such as ELEP HOLDER [registered trademark] such as ELP DU-300, ELP DU-2385KS, ELP DU-2187G, ELP NBD-3190K, and ELP UE-2091J (manufactured by Nitto Denko Corporation); Adwill D-210, Adwill D-203, Adwill D-202, Adwill D-175, and Adwill D-675 (all manufactured by LINTEC Corporation); SUMILITE [registered trademark] FLS N8000 series (manufactured by Sumitomo Bakelite); and UC353EP-110 (manufactured by Furukawa Electric Co., Ltd.), can be used. In addition, as commercially available products of the UV peelable type resin layer, for example, background tapes such as ELP RF-7232DB, and ELP UB-5133D (both manufactured by Nitto Denko Corporation); and SP-575B-150, SP-541B-205, SP-537T-160, and SP-537T-230 (all manufactured by Furukawa Electric Co., Ltd.), can be used.

The above-described film with a pressure sensitive adhesive layer can be formed using a known surface protection tape attaching device and a laminator.

As the method of forming the resin layer 44, in addition to the above-described methods, for example, a method of applying a resin composition containing an antioxidant material, a polymer material, a solvent (for example, methyl ethyl ketone) described later, and the like to the front surface or rear surface of the anodized film 38 and the protrusions of the conductive paths and drying the composition, and as necessary, performing baking, and the like can be used.

The method of applying the resin composition is not particularly limited and for example, conventionally known coating methods such as a spin coating method, a gravure coating method, a reverse coating method, a die coating method, a blade coating method, a roll coating method, an air knife coating method, a screen coating method, a bar coating method, and a curtain coating method can be used.

In addition, the drying method after application is not particularly limited and for example, a holding treatment for several seconds to several tens of minutes at a temperature of 0° C. to 100° C. in the atmosphere, a holding treatment for several tens of minutes to several hours at a temperature of 0° C. to 80° C. under reduced pressure, and the like may be used.

In addition, the baking method after drying is not particularly limited since the method varies depending on the polymer material to be used. However, in a case of using a polyimide resin, for example, a heating treatment for 2 minutes to 60 minutes at a temperature of 160° C. to 240° C. and the like may be used. In a case of using an epoxy resin, for example, a heating treatment for 2 minutes to 60 minutes at a temperature of 30° C. to 80° C. and the like may be used.

Figure 15:
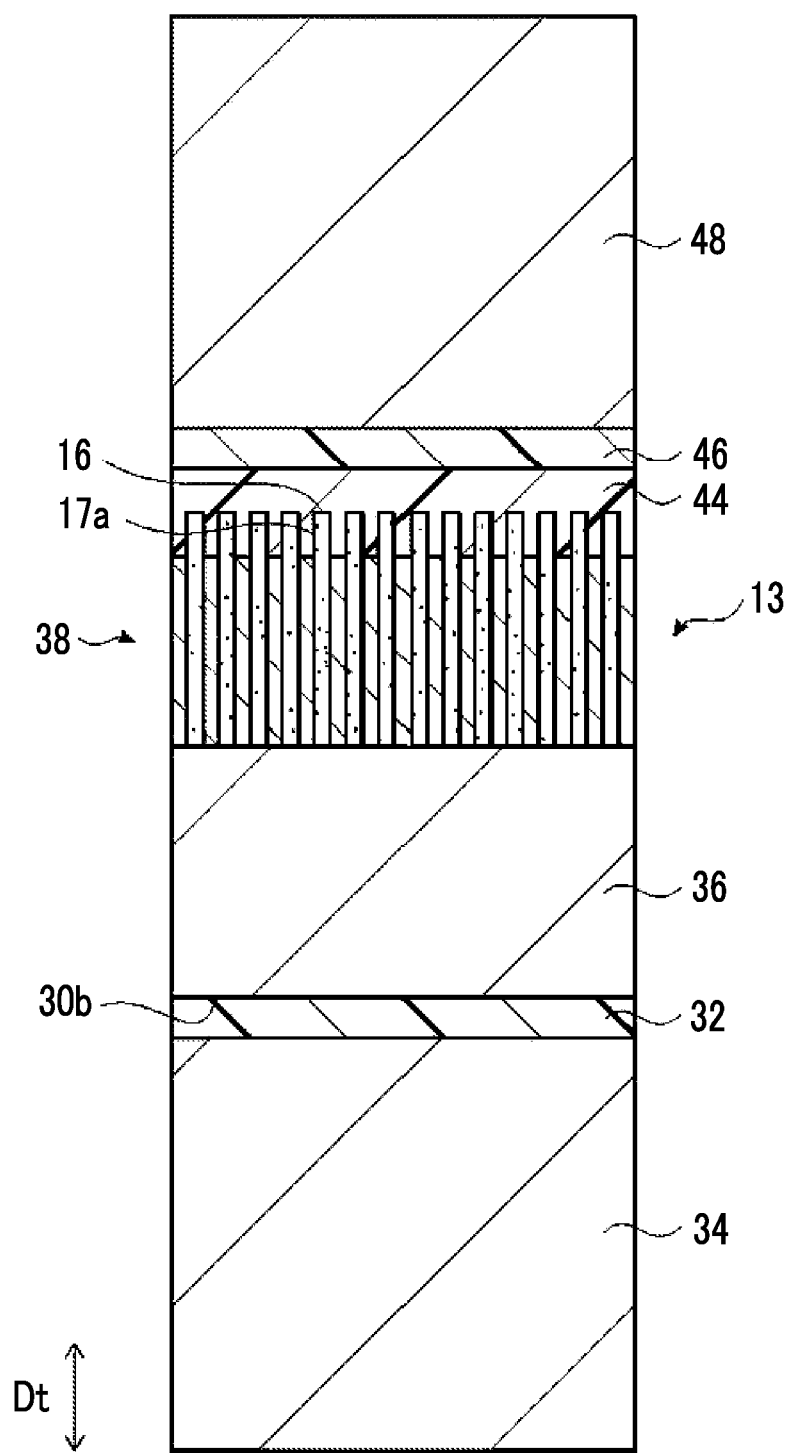
FIG. 15 is a schematic view showing the step of the example of the method for manufacturing a structure according to the embodiment of the present invention.

Next, as shown in FIG. 15, a double-sided pressure sensitive adhesive 46 is attached to the resin layer 44. Since the double-sided pressure sensitive adhesive 46 has the same configuration as the above-described double-sided pressure sensitive adhesive 32, the detailed description thereof is omitted.

Then, the support member 48 is attached to the double-sided pressure sensitive adhesive 46. Since the support member 48 has the same configuration as the above-described support member 34, the detailed description thereof is omitted. The support member 48 functions as a support and the support member 48 is attached to improve handleability. The support member 48 has the same outer shape as the anodized film 38.

Figure 16:
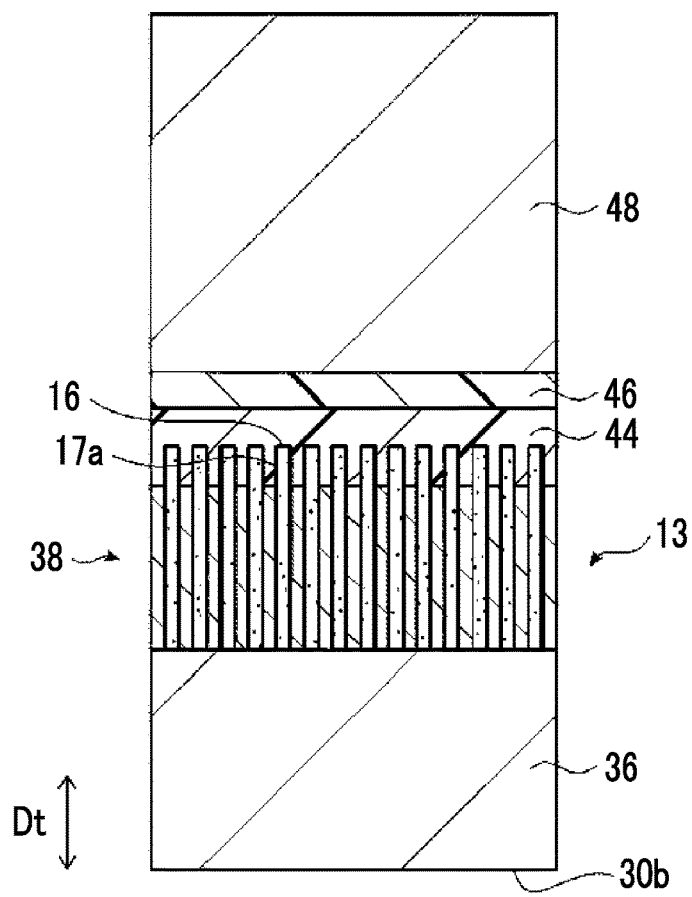
FIG. 16 is a schematic view showing the step of the example of the method for manufacturing a structure according to the embodiment of the present invention.

Next, for example, by heating the double-sided pressure sensitive adhesive 32 to a predetermined temperature, the adhesive force of the double-sided pressure sensitive adhesive 32 is weakened and the support member 34 is removed from the aluminum base 36 as shown in FIG. 16.

Figure 17:
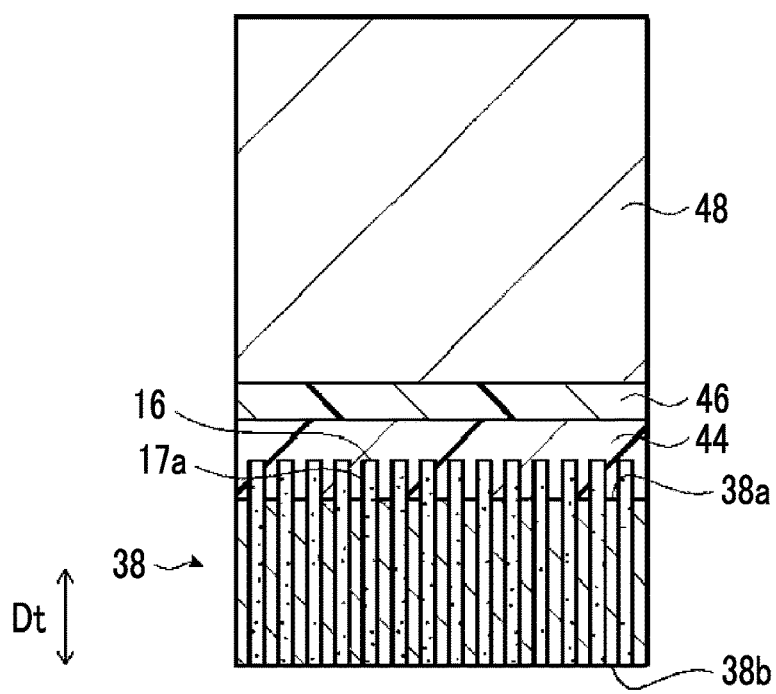
FIG. 17 is a schematic view showing the step of the example of the method for manufacturing a structure according to the embodiment of the present invention.

Next, as shown in FIG. 17, for example, the aluminum base 36 is removed by dissolution, and the rear surface 38b of the anodized film 38 is exposed. For the dissolution of the aluminum base 36, it is preferable to use a treatment liquid in which the anodized film 38 is not easily dissolved and aluminum is easily dissolved.

As long as the aluminum base 36 can be removed without damaging the anodized film 38, the removal method is not limited to dissolution. Removing the aluminum base 36 is referred to as a substrate removal step.

[Substrate Removal Step]

The dissolution rate for aluminum of the treatment liquid for dissolving the aluminum base 36 is preferably 1 μm/min or more, more preferably 3 μm/min or more, and still more preferably 5 μm/min or more. Similarly, the dissolution rate for the anodized film is preferably 0.1 nm/min or less, more preferably 0.05 nm/min or less, and still more preferably 0.01 nm/min or less.

Specifically, a treatment liquid containing at least one metal compound that has a lower ionization tendency than aluminum preferably has a hydrogen ion index (pH) of 4 or less or 8 or more, more preferably a pH of 3 or less or 9 or more, and still more preferably 2 or less or 10 or more.

Such treatment liquids are based on aqueous acid or alkaline solutions, and for example, manganese, zinc, chromium, iron, cadmium, cobalt, nickel, tin, lead, antimony, bismuth, copper, mercury, silver, palladium, platinum, gold compounds (for example, platinum chloride), fluorides thereof, chlorides thereof, and the like are preferably formulated.

Among these, an aqueous acid solution base is preferable, and it is preferable to blend a chloride.

Particularly, from the viewpoint of treatment latitude, a treatment liquid (hydrochloric acid/mercury chloride) in which mercury chloride is blended in a hydrochloric aqueous acid solution, and a treatment liquid (hydrochloric acid/copper chloride) in which copper chloride is blended in a hydrochloric aqueous acid solution are preferable.

The composition of such a treatment liquid is not particularly limited and for example, a bromine/methanol mixture, a bromine/ethanol mixture, aqua regia, and the like can be used.

In addition, the acid or alkali concentration of such a treatment liquid is preferably 0.01 to 10 mol/L and more preferably 0.05 to 5 mol/L.

Further, the temperature of the treatment using such a treatment liquid is preferably −10° C. to 80° C. and more preferably 0° C. to 60° C.

In addition, the dissolution of the above-described aluminum base 36 is performed by bringing the aluminum base 36 after the above-described metal filling step into contact with the above-described treatment liquid. The contact method is not particularly limited and for example, an immersion method and a spray method may be used. Among these, an immersion method is preferable. At this time, the contact time is preferably 10 seconds to 5 hours and more preferably 1 minute to 3 hours.

Figure 18:
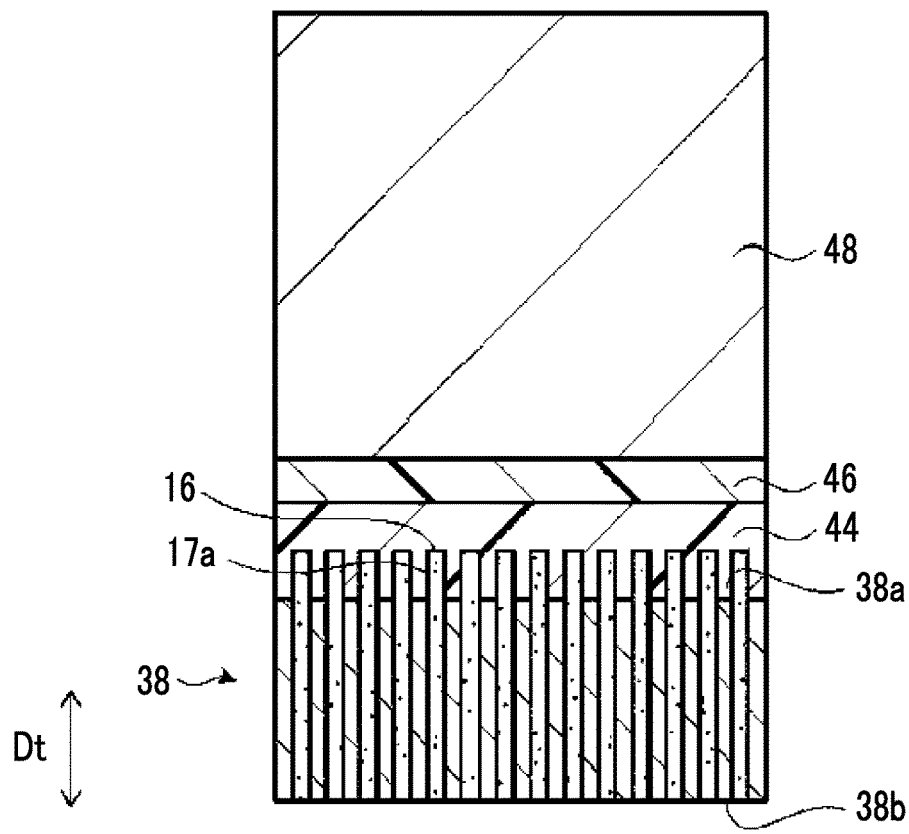
FIG. 18 is a schematic view showing the step of the example of the method for manufacturing a structure according to the embodiment of the present invention.

Next, as shown in FIG. 18, from the rear surface 38b side of the anodized film 38, the micropores 39 (refer to FIG. 24) are filled with an insulating substance. Since the step of filling the micropores with the insulating substance is the same as the above-described insulating substance filling step, the detailed description thereof is omitted.

Figure 19:
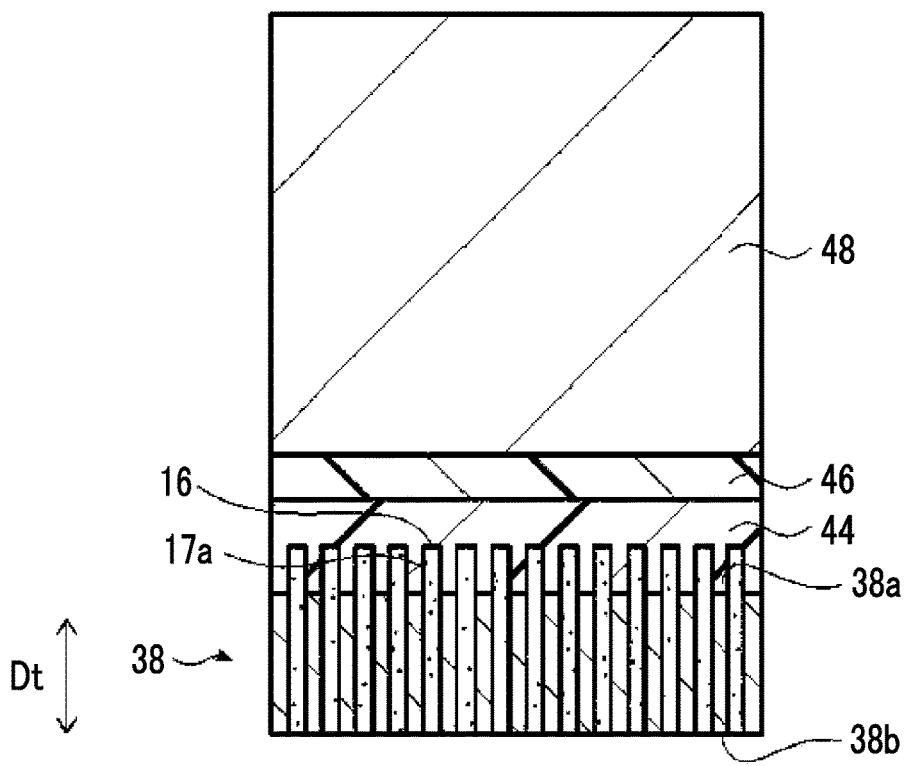
FIG. 19 is a schematic view showing the step of the example of the method for manufacturing a structure according to the embodiment of the present invention.

Next, as shown in FIG. 19, the rear surface 38b of the anodized film 38 is polished. Since the polishing of the rear surface 38b of the anodized film 38 is the same as the polishing of the front surface 38a of the anodized film 38 shown in FIG. 12, the detailed description thereof is omitted. Even in this case, in a case where the rear surface 38b of the anodized film 38 is polished, the insulating substance filling the inside of the structure is not polished.

Figure 20:
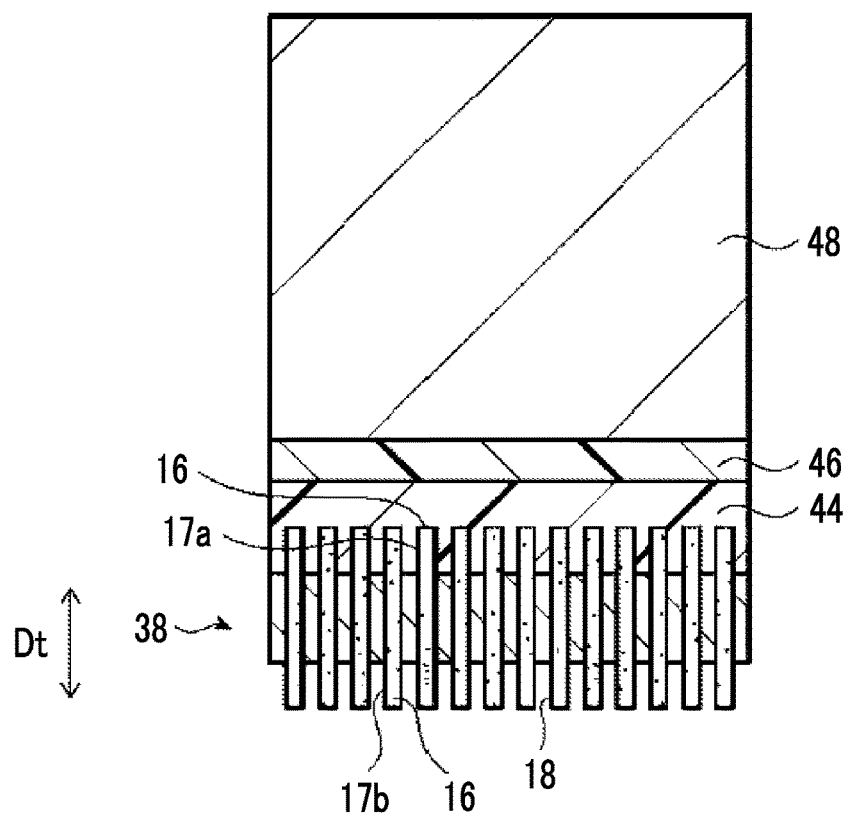
FIG. 20 is a schematic view showing the step of the example of the method for manufacturing a structure according to the embodiment of the present invention.

Next, as shown in FIG. 20, the rear surface 38b of the anodized film 38 is partially removed in the thickness direction Dt and the above-described filled metal is caused to protrude from the rear surface 38b of the anodized film 38. That is, the conductive path 16 is caused to protrude from the rear surface 38b of the anodized film 38. A portion in which the conductive path 16 protrudes from the rear surface 38b of the anodized film 38 is the protrusion 17b.

Since the step of causing the above-described filled metal to protrude from the rear surface 38b of the anodized film 38 is the same as the above-described trimming step, the detailed description thereof is omitted.

Figure 21:
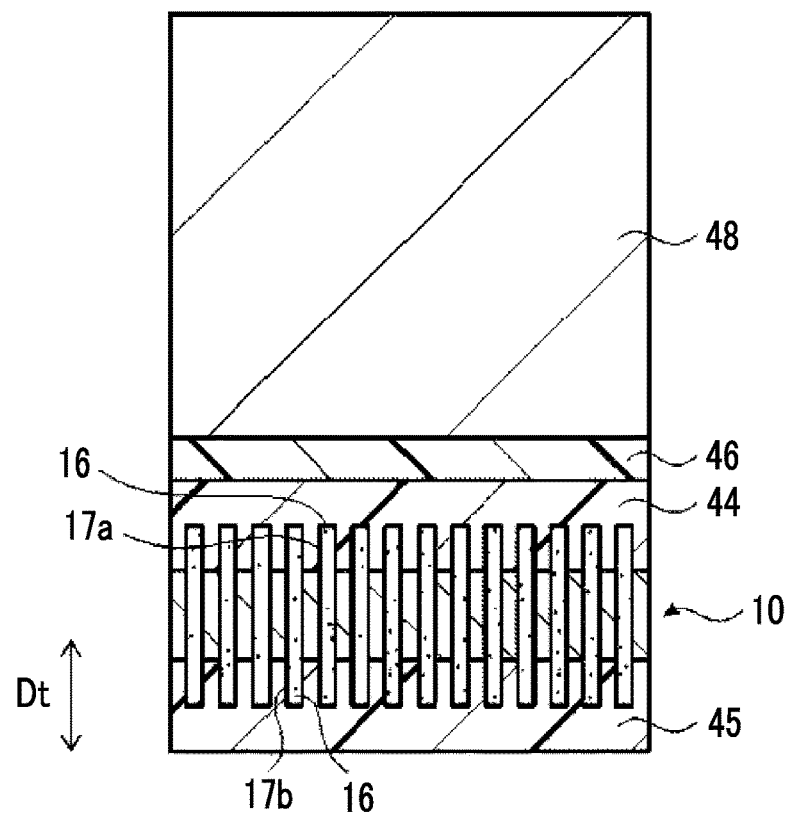
FIG. 21 is a schematic view showing the step of the example of the method for manufacturing a structure according to the embodiment of the present invention.
Figure 22:
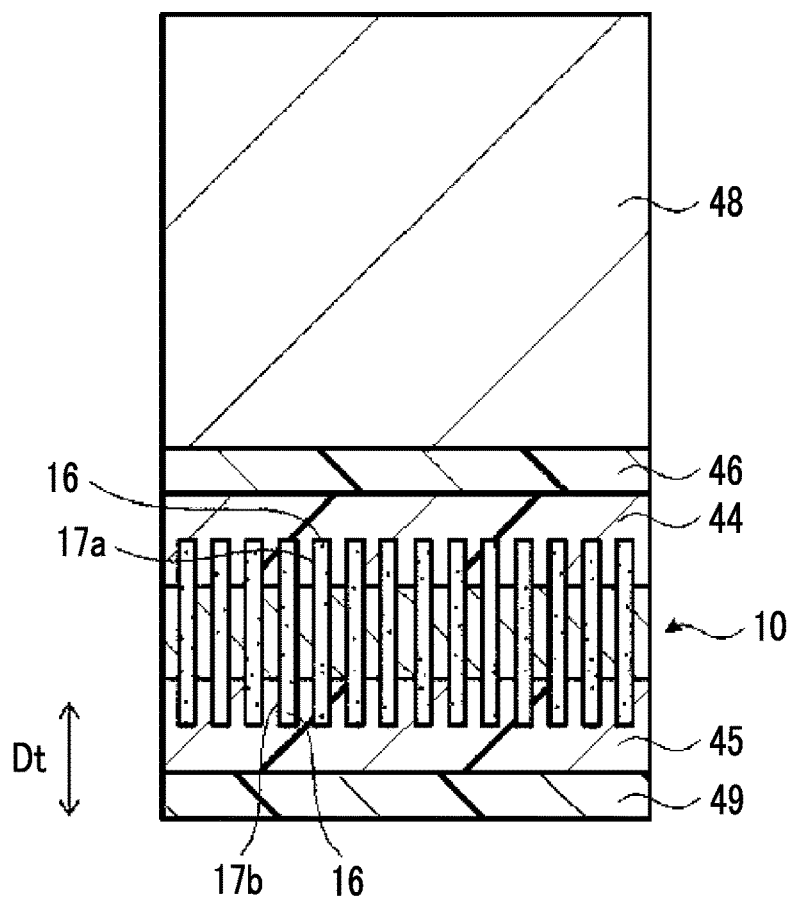
FIG. 22 is a schematic view showing the step of the example of the method for manufacturing a structure according to the embodiment of the present invention.

Next, as shown in FIG. 21, a resin layer 45 in which the protrusions 17b of the conductive paths 16 of the rear surface 38b of the anodized film 38 are embedded is formed on the rear surface 38b of the anodized film 38. The resin layer 45 is provided to protect the protrusions 17b of the conductive paths 16. Thus, a structure 10 in a state in which the support member 48 is attached is formed.

Since the method of forming the resin layer 45 is the same as the resin layer forming step of the resin layer 44, the detailed description thereof is omitted.

Next, a protective layer 49 is formed on the resin layer 45. The protective layer 49 is provided to protect the structure 10 from the surface opposite to the support member 48.

In any of the manufacturing methods described above, each of the above steps can be performed on a single sheet.

Since the protective layer 49 is used for protecting the structure surface from scratches and the like, an easily releasable tape is preferable. As the protective layer 49, for example, a film with a pressure sensitive adhesive layer may be used.

As the film with a pressure sensitive adhesive layer, for example, commercially available products sold under series names of SUNYTECT [registered trademark] (manufactured by Aibaken Kogyo Co., Ltd.) having a pressure sensitive adhesive layer formed on the surface of a polyethylene resin film, E-MASK [registered trademark] (manufactured by Nitto Denko Corporation) having a pressure sensitive adhesive layer formed on the surface of a polyethylene terephthalate resin film, MASTEC [registered trademark] (manufactured by Fujimori Kogyo K.K.) having a pressure sensitive adhesive layer formed on the surface of a polyethylene terephthalate resin film, and the like can be used.

In addition, the method of attaching the film with a pressure sensitive adhesive layer is not particularly limited and the film can be attached using a known surface protection tape attaching device and a laminator.

Hereinafter, the configuration of the structure 10 will be more specifically described.

[Insulating Base]

The insulating base is made of an inorganic material and is not particularly limited as long as the insulating base may be an insulating base having substantially the same electrical resistivity (about $10^{14}$ Ω·cm) as that of an insulating base constituting a conventionally known anisotropic conductive film or the like.

The "made of an inorganic material" is a definition to distinguish the material of the insulating base from a polymer material constituting the resin layer, which will be described later, and is not limited to an insulating base made of only an inorganic material but refers to an insulating base having an inorganic material as a main component (50% by mass or more).

Examples of the insulating base include a metal oxide base, a metal nitride base, a glass base, a ceramic base such as silicon carbide or silicon nitride, a carbon base such as diamond-like carbon, a polyimide base, and composite materials thereof. In addition to these materials, as the insulating base, for example, a film formed of an inorganic material containing 50% by mass or more of a ceramic material or a carbon material on an organic material having a through-passage may be used.

In the insulating base, as described above, the micropores 39 (refer to FIG. 8) are formed as the through-holes 14 (refer to FIG. 1). For the reason that the through-holes 14 are easily formed, a metal oxide base is preferable and an anodized film of a valve metal is more preferable.

Here, specific examples of the valve metal include aluminum, tantalum, niobium, titanium, hafnium, zirconium, zinc, tungsten, bismuth, and antimony. Among these, an anodized film (base) of aluminum is preferably used because aluminum has a good dimensional stability and is relatively inexpensive.

A thickness h of the insulating base 12 is preferably in a range of 1 to 1,000 μm, more preferably in a range of 5 to 500 μm, and still more preferably in a range of 10 to 300 μm. In a case where the thickness of the insulating base is within this range, the handleability of the insulating base becomes satisfactory.

The thickness h of the insulating base 12 is obtained by cutting the insulating base 12 in the thickness direction Dt with a focused ion beam (FIB), observing the cross section thereof with a field emission-scanning electron microscope at a magnification of 200,000 times, acquiring the contour shape of the insulating base 12, and averaging the thickness measured at 10 points in a region corresponding to the thickness h.

The interval between the respective through-holes in the insulating base is preferably 5 nm to 800 nm, more preferably 10 nm to 200 nm, and still more preferably 50 nm to 140 nm. In a case where the interval between the respective through-holes in the insulating base within this range, the insulating base sufficiently functions as an insulating partition wall. The interval between the through-holes is the same as the interval between the conductive paths.

Here, the interval between the through-holes, that is, the interval between the conductive paths refers to a width w between adjacent conductive paths (refer to FIG. 1), and also refers to an average value of widths between adjacent conductive paths measured at 10 points by observing the cross section of the anisotropic conductive member with a field emission-scanning electron microscope at a magnification of 200,000 times.

[Conductive Path]

The plurality of conductive paths 16 penetrate the anodized film 38 in the thickness direction and are provided in a mutually electrically insulated state. The conductive path 16 is constituted of a conductive substance such as a metal, and has a protrusion 17a that protrudes from the front surface 12a of the insulating base 12 and a protrusion 17b that protrudes from the rear surface 12b. As shown in FIG. 21, the protrusion 17a may be embedded in the resin layer 44 and the protrusion 17b may be embedded in the resin layer 45.

As described above, the plurality of insulators 18 do not have conductivity. Both ends of the insulator 18 are flush with the front surface 12a or rear surface 12b of the insulating base 12 in the thickness direction Dt, protrude with respect to the surface in the thickness direction Dt, or are recessed from the surface in the thickness direction Dt. In a case where the insulator protrudes, the relationship of protrusion length δ≤protrusion length Ld×0.3 is satisfied. In a case where the insulator is recessed, the relationship of recess length γ≤thickness h of insulator×0.1 is satisfied.

<Conductive Substance>

As the conductive substance constituting the conductive paths, the exemplified filling metals in the above-described metal filling step can be used.

<Insulating Substance>

As the insulating substance constituting the insulators, the exemplified filling insulating substances in the above-described insulating substance filling step can be used.

<Protrusion>

In a case where the structure 10 is used as an anisotropic conductive member, in electrical connection or physical connection of the anisotropic conductive member and the electrode by a method of compression or the like, from the reason that insulating properties in the plane direction in a case where the protrusions of the conductive paths 16 are collapsed can be sufficiently secured, the aspect ratio of the protrusion of the conductive path 16 (height of protrusion/diameter of protrusion) is preferably 0.5 or more and less than 50, more preferably 0.8 to 20, and still more preferably 1 to 10.

In addition, from the viewpoint of following the surface shape of a semiconductor chip or a semiconductor wafer which is an object to be connected, the height of the protrusion of the conductive path 16 is preferably 20 nm or more, more preferably 100 nm to 7,000 nm, still more preferably 100 nm to 1,000 nm, and even still more preferably 100 nm to 300 nm.

The height of the protrusion of the conductive path 16 refers to an average value of heights of the protrusions of the conductive paths 16 measured at 10 points by observing the cross section of the anisotropic conductive member with a field emission-scanning electron microscope at a magnification of 20,000 times.

The diameter of the protrusion of the conductive path 16 refers to an average value of diameters of the protrusions of the conductive paths 16 measured at 10 points by observing the cross section of the anisotropic conductive member with a field emission-scanning electron microscope.

<Other Shapes>

The conductive path 16 and the insulator have a columnar shape and the diameter d of the conductive path (refer to FIG. 2) is preferably more than 5 nm and 10 μm or less and more preferably 20 nm to 1,000 nm, similar to the diameter of the protrusion. The diameter d of the conductive path corresponds to the inner diameter of the through-hole 14.

As described above, the conductive paths 16 are present in a state in which the conductive paths are mutually insulated from each other by the insulating base 12. The density thereof is preferably 20,000 conductive paths/mm$^2$ or more, more preferably 2,000,000 conductive paths/mm$^2$ or more, still more preferably 10,000,000 conductive paths/mm$^2$ or more, particularly preferably 50,000,000 conductive paths/mm$^2$ or more, and most preferably 100,000,000 conductive paths/mm$^2$ or more.

Further, the center-to-center distance p between each adjacent conductive path 16 (refer to FIG. 2) is preferably 20 nm to 500 nm, more preferably 40 nm to 200 nm, and still more preferably 50 nm to 140 nm.

[Resin Layer]

As described above, the resin layer is provided on the front surface and the rear surface of the insulating base and the protrusions of the conductive paths are embedded as described above. That is, the resin layer covers the end portions of the conductive paths protruding from the insulating base and protects the protrusions.

The resin layer is formed by the above-described resin layer forming step. It is preferable that the resin layer exhibits fluidity in a temperature range of, for example, 50° C. to 200° C. and is cured at 200° C. or higher.

The resin layer is formed by the resin layer forming step described above, but the composition of the resin layer shown below can also be used. Hereinafter, the composition of the resin layer will be described. The resin layer contains a polymer material. The resin layer may contain an antioxidant material.

<Polymer Material>

The polymer material contained in the resin layer is not particularly limited and but for the reason that the gap between a semiconductor chip or a semiconductor wafer and the anisotropic conductive member can be effectively filled and adhesiveness with the semiconductor chip or a semiconductor wafer is further improved, a thermosetting resin is preferable.

Specific examples of the thermosetting resin include epoxy resins, phenolic resins, polyimide resins, polyester resins, polyurethane resins, bismaleimide resins, melamine resins, and isocyanate-based resins.

Among these, for the reason of further improving insulation reliability and obtaining excellent chemical resistance, it is preferable to use a polyimide resin and/or an epoxy resin.

<Antioxidant Material>

Specific examples of the antioxidant material contained in the resin layer include 1,2,3,4-tetrazole, 5-amino-1,2,3,4-tetrazole, 5-methyl-1,2,3,4-tetrazole, 1H-tetrazole-5-acetic acid, 1H-tetrazol-5-succinic acid, 1,2,3-triazole, 4-amino-1,2,3-triazole, 4,5-diamino-1,2,3-triazole, 4-carboxy-1H-1,2,3-triazole, 4,5-dicarboxy-1H-1,2,3-triazole, 1H-1,2,3-triazole-4-acetic acid, 4-carboxy-5-carboxymethyl-1H-1,2,3-triazole, 1,2,4-triazole, 3-amino-1,2,4-triazole, 3,5-diamino-1,2,4-triazole, 3-carboxy-1,2,4-triazole, 3,5-dicarboxy-1,2,4-triazole, 1,2,4-triazole-3-acetic acid, 1H-benzotriazole, 1H-benzotriazole-5-carboxylic acid, benzofuroxane, 2,1,3-benzothiazole, o-phenylenediamine, m-phenylenediamine, catechol, o-aminophenol, 2-mercapto benzothiazole, 2-mercaptobenzimidazole, 2-mercaptobenzoxazole, melamine, and derivatives thereof.

Among these, benzotriazole and a derivative thereof are preferable.

Examples of the benzotriazole derivative include substituted benzotriazoles having a benzene ring of benzotriazole substituted with a hydroxyl group, an alkoxy group (for example, methoxy group or ethoxy group), an amino group, a nitro group, an alkyl group (for example, methyl group, ethyl group, or butyl group), a halogen atom (for example, fluorine, chlorine, bromine, or iodine), and the like. Further, naphthalenetriazole and naphthalenebistriazole, as well as substituted naphthalenetriazoles and substituted naphthalenebistriazole substituted as described above may be used.

Other examples of the antioxidant material contained in the resin layer include higher fatty acids, higher fatty acid copper, phenolic compounds, alkanolamines, hydroquinones, copper chelating agents, organic amines, and organic ammonium salts, which are common antioxidants.

The content of the antioxidant material contained in the resin layer is not particularly limited but from the viewpoint of the anticorrosive effect, the content of the antioxidant material is preferably 0.0001% by mass or more and more preferably 0.001% by mass or more with respect of the total mass of the resin layer. In addition, for the reason of obtaining an appropriate electric resistance in the main bonding process, the content thereof is preferably 5.0% by mass or less and more preferably 2.5% by mass or less.

<Migration Prevention Material>

The resin layer preferably contains a migration prevention material for the reason that insulation reliability is further improved by trapping metal ions or halogen ions that may be contained in the resin layer, and metal ions derived from the semiconductor chip and the semiconductor wafer.

As the migration prevention material, for example, an ion exchanger, specifically, a mixture of cation exchanger and anion exchanger, or only a cation exchanger can be used.

Here, the cation exchanger and the anion exchanger can be respectively appropriately selected from inorganic ion exchangers and organic ion exchangers described later.

(Inorganic Ion Exchanger)

Examples of inorganic ion exchangers include hydrated oxides of metals typified by hydrous zirconium oxide.

As the kind of metal, for example, in addition to zirconium, iron, aluminum, tin, titanium, antimony, magnesium, beryllium, indium, chromium, bismuth, and the like are known.

Among these, the zirconium-based exchanger has an exchange capacity for cations $Cu^{2+}$ and $Al^{3+}$. In addition, the iron-based exchanger also has an exchange capacity for $Ag^+$ and $Cu^{2+}$. Similarly, the tin-based, titanium-based, and antimony-based exchangers are cation exchangers.

On the other hand, the bismuth-based exchanger has an exchange capacity for an anion $Cl^-$.

Further, the zirconium-based exchanger exhibits an anion exchange capacity depending on the production conditions. The same is applied to the aluminum-based and tin-based exchangers.

As inorganic ion exchangers other than the above examples, acid salts of polyvalent metals typified by zirconium phosphate, heteropolyacid salts typified by ammonium molybdophosphate, and synthetic products such as insoluble ferrocyanide are known.

Some of these inorganic ion exchangers are already commercially available, and for example, various grades are known in the trade name "IXE" of Toagosei Co., Ltd.

In addition to the above synthetic products, powders of inorganic ion exchangers of natural substances such as zeolites and montmorillonite can also be used.

(Organic Ion Exchanger)

Examples of organic ion exchangers include a crosslinked polystyrene having a sulfonic acid group as a cation exchanger and in addition to the above crosslinked polystyrene, crosslinked polystyrenes having a carboxylic acid group, a phosphonic acid group, and a phosphinic acid group may be used.

Other examples thereof include crosslinked polystyrenes having a quaternary ammonium group, a quaternary phosphonium group and a tertiary sulfonium group as an anion exchanger.

These inorganic ion exchangers and organic ion exchangers may be appropriately selected in consideration of cations to be trapped, the kind of anion, and an ion exchange capacity thereof. Of course, it is needless to say that an inorganic ion exchanger and an organic ion exchanger may be used as a mixture.

Since a step of manufacturing an electronic element includes a heating process, an inorganic ion exchanger is preferable.

In addition, regarding the mixing ratio of the migration prevention material and the polymer material, for example, from the viewpoint of mechanical strength, the amount of the migration prevention material is preferably 10% by mass or less, the amount of the migration prevention material is more preferably 5% by mass or less, and the amount of the migration prevention material is still more preferably 2.5% by mass or less. From the viewpoint of suppressing migration in a case where a semiconductor chip or a semiconductor wafer and the anisotropic conductive member are bonded, the amount of the migration prevention material is preferably 0.01% by mass or more.

<Inorganic Filler>

The resin layer preferably contains an inorganic filler.

The inorganic filler is not particularly limited and can be appropriately selected from known inorganic fillers. Examples thereof include kaolin, barium sulfate, barium titanate, silicon oxide powder, silicon oxide fine powder, silica produced by a gas phase method, indefinitely shaped silica, crystalline silica, molten silica, spherically shaped silica, talc, clay, magnesium carbonate, calcium carbonate, aluminum oxide, aluminum hydroxide, mica, aluminum nitride, zirconium oxide, yttrium oxide, silicon carbide, and silicon nitride.

For the reason of preventing the inorganic filler from entering between the conductive paths and further improving conduction reliability, the average particle diameter of the inorganic filler is preferably larger than the interval between the conductive paths.

The average particle diameter of the inorganic filler is preferably 30 nm to 10 μm and more preferably 80 nm to 1 μm.

Here, the average particle diameter is an average particle diameter of primary particle diameters measured with a laser diffraction and scattering type particle diameter measuring device (MICROTRAC MT3300 manufactured by Nikkiso Co., Ltd.).

<Curing Agent>

The resin layer may contain a curing agent.

In a case where resin layer contains a curing agent, from the viewpoint of suppressing defective bonding with the surface shape of a semiconductor chip or a semiconductor wafer which is an object to be connected, instead of using a curing agent which is a solid at normal temperature, a curing agent which is a liquid at normal temperature is preferably incorporated in the pressure sensitive adhesive layer.

Here, the term "solid at normal temperature" refers to being a solid at 25° C. and for example, refers to a substance having a melting point higher than 25° C.

Specific examples of the curing agent include aromatic amines such as diaminodiphenylmethane and diaminodiphenylsulfone, aliphatic amines, imidazole derivatives such as 4-methylimidazole, dicyandiamide, tetramethylguanidine, thiourea-added amine, carboxylic acid anhydride such as methyl hexahydrophthalic acid anhydride, carboxylic acid hydrazide, carboxylic acid amide, polyphenol compounds, novolak resin, and polymercaptan. Among these curing agents, a curing agent which is a liquid at 25° C. can be appropriately selected. The curing agents may be used singly or in combination of two or more thereof.

The resin layer may contain various additives, which are generally widely added to a resin insulation film of a semiconductor package within a range not deteriorating the properties thereof, such as a dispersing agent, a buffer agent, and a viscosity adjuster.

<Shape>

For the reason of protecting the conductive path, the thickness of the resin layer is larger than the height of the protrusion of the conductive path and is preferably 1 μm to 5 μm.

The present invention is basically configured as described above. Although the structure, the method for manufacturing a structure, the laminate, and the semiconductor package according to the embodiments of the present invention have been described in detail, the present invention is limited to the above-described embodiments. Of course, various improvements or changes may be made without departing from the spirit of the present invention.

EXAMPLES

The present invention is further specifically described with reference to the following examples. The materials, the reagents, the amount used, the amount of substances, the ratios, the treatment contents, the treatment procedures, and the like shown in the examples described below can be appropriately changed as long as it is within the gist of the present invention. Accordingly, the scope of the present invention should not be limitatively interpreted by the specific examples described below.

In the examples, structures of Examples 1 to 6 and structures of Comparative Examples 1 to 3 were prepared. Regarding the structures of Examples 1 to 6 and Comparative Examples 1 to 3, the short circuit and the conduction resistance were evaluated. The evaluation results of the short circuit and the conduction resistance are shown in Table 1 below.

Hereinafter, the short circuit and the conduction resistance will be described. The following test element group chip (TEG chip) was used for the evaluation of the short circuit and conduction resistance.

[Evaluation]

<TEG Chip>

A test element group chip (TEG chip) having a Cu pad and an interposer were prepared. A daisy chain pattern for measuring conduction resistance and a comb teeth pattern for measuring insulation resistance are included in the TEG chip and the interposer. The insulating layers thereof were formed of SiN. The TEG chip had a chip size of 8 mm square and a chip in which a ratio of the electrode area (copper post) to the chip area was 25% was prepared. The TEG chip corresponds to a semiconductor chip. Since the interposer included lead-out wires in the vicinity thereof, a chip size of 10 mm square was prepared.

Next, the TEG chip, the prepared structure, and the interposer were bonded to be laminated in this order using a chip bonder (DB250, manufactured by SHIBUYA CORPORATION) under the condition of a temperature of 270° C. for 10 minutes. In this case, the positions of the Cu pads of the TEG chip and the interposer were aligned according to the alignment mark formed at the corners of the chip in advance not to cause positional deviation.

Next, the short circuit evaluation will be described.

<Evaluation of Short Circuit>

A signal line for resistance measurement was soldered to the lead-out wiring pad of the comb teeth pattern portion of the interposer and the conduction was evaluated at normal temperature and in the atmosphere.

Based on the resistance value results, the evaluation was carried out according to the following evaluation standards. The evaluation results are shown in the column "Short circuit" in Table 1 below.

"A": The resistance value is 0.1 times or more the design resistance.

"B": The resistance value is 0.01 times or more and less than 0.1 times the design resistance.

"C": The resistance value is 0.001 times or more and less than 0.01 times the design resistance.

"D": The resistance value is less than 0.001 times the design resistance.

Next, the evaluation of conduction resistance is described.

<Evaluation of Conduction Resistance>

A signal line for resistance measurement was soldered to the lead-out wiring pad of the comb teeth pattern portion of the interposer and the conduction was evaluated at normal temperature and in the atmosphere.

Based on the results of resistance values, the evaluation was carried out according to the following evaluation standards. The evaluation results are shown in the column "Conduction resistance" in Table 1 below.

"A": The resistance value is less than 10 times the design resistance.

"B": The resistance value is 10 times or more and less than 100 times the design resistance.

"C": The resistance value is 100 times or more and less than 1,000 times the design resistance.

"D": The resistance value is 1,000 times or more the design resistance.

Next, the protrusion length and the contact rate of the structure will be described.

<Protrusion Length>

The protrusion length of the conductive substance after the trimming step of the rear surface side was set to the protrusion length of the conductive path. In addition, the protrusion length of the insulating substance was set to the protrusion length of the insulator. The protrusion length of the conductive path and the protrusion length of the insulating substance are shown in Table 1 below.

Regarding the protrusion length of the conductive path and the protrusion length of the insulating substance, after the trimming step of the rear surface side, the structure was cut with a focused ion beam (FIB) in the thickness direction of both the front surface and the rear surface of the structure, the cross section was captured with a field emission-scanning electron microscope (FE-SEM) (magnification: 50,000 times), the average values of thicknesses measured at 10 points of each of the front surface and the rear surface were obtained, and the average values were used as the protrusion length of the conductive path and the protrusion length of the insulating substance. In addition, the minus numerical values in Table 1 below indicate that the insulating substance is recessed.

<Contact Rate>

For the contact rate, the surface image of the structure (magnification: 100,000 times) was captured by FE-SEM, it was confirmed whether adjacent conductive paths were in contact with each other for 100 conductive paths. The contact rate is calculated using the following equation.

Contact rate=((number of conductive paths in contact with adjacent conductive paths)/100)×100 (%)

Hereinafter, Examples 1 to 6 and Comparative Examples 1 to 3 will be described.

Example 1

[Structure]

<Preparation of Aluminum Substrate>

Molten metal was prepared using an aluminum alloy containing Si: 0.06% by mass, Fe: 0.30% by mass, Cu: 0.005% by mass, Mn: 0.001% by mass, Mg: 0.001% by mass, Zn: 0.001% by mass, and Ti: 0.03% by mass, and a balance consisting of Al and unavoidable impurities, a molten metal treatment and filtration were carried out. Then, an ingot having a thickness of 500 mm and a width of 1,200 mm was prepared by a direct chill (DC) method.

Next, the surface of the resulted ingot was cut by a facing machine so as to have an average thickness of 10 mm and then heated at 550° C. for about 5 hours to carry out a soaking treatment. When the temperature decreased to 400° C., the ingot was formed into a rolled plate having a thickness of 2.7 mm by using a hot rolling mill.

Further, the heat treatment was conducted at 500° C. using a continuous annealing machine and then the annealed plate was cold-rolled to finish the plate to have a thickness of 1.0 mm, thereby obtaining a Japanese Industrial Standards (JIS) 1050 aluminum substrate.

The aluminum substrate was formed in a wafer shape with a diameter of 200 mm (8 inches) and then each of the following treatments was carried out.

<Electropolishing Treatment>

The aluminum substrate is subjected to an electropolishing treatment using an electropolishing solution having the following composition under the conditions of a voltage of 25 V, a solution temperature of 65° C., and a solution flow velocity of 3.0 m/min.

A carbon electrode was used as a cathode and GP0110-30R (manufactured by TAKASAGO LTD.) was used as a power supply. The flow velocity of the electrolytic solution was measured using a VORTEX FLOW MONITOR FLM 22-10 PCW (manufactured by AS ONE Corporation).

(Composition of Electropolishing Solution)
85% by mass Phosphoric acid (manufactured by Wako Pure Chemical Industries, Ltd.): 660 mL
Pure water: 160 mL
Sulfuric acid: 150 mL
Ethylene glycol: 30 mL <Anodizing Treatment Step>

Subsequently, an anodizing treatment using a self-regulation method was carried out on the aluminum substrate subjected to the electropolishing treatment according to the procedure described in JP2007-204802A.

The aluminum substrate subjected to the electropolishing treatment was subjected to a preliminary anodizing treatment for 5 hours with an electrolytic solution of 0.50 mol/L oxalic acid under the following conditions: voltage: 40 V; solution temperature: 16° C.; and solution flow velocity: 3.0 m/min.

After preliminary anodizing treatment, the aluminum substrate was then subjected to a film removal treatment in which the substrate was immersed for 12 hours in a mixed aqueous solution (solution temperature: 50° C.) of 0.2 mol/L chromic anhydride and 0.6 mol/L phosphoric acid.

Then, the aluminum substrate was subjected to a re-anodizing treatment for 3 hours and 45 minutes with an electrolytic solution of 0.50 mol/L oxalic acid under the following conditions: voltage, 40 V; solution temperature, 16° C.; and solution flow velocity, 3.0 m/min. An anodized film having a thickness of 30 µm was thus obtained.

The preliminary anodizing treatment and the re-anodizing treatment were both carried out using a stainless steel electrode as the cathode and using a GP0110-30R (manufactured by Takasago, Ltd.) as the power supply. NEO-COOL BD36 (Yamato Scientific Co., Ltd.) was used as a cooling device, and PAIRSTIRRER PS-100 (manufactured by Tokyo Rikakikai Co., Ltd.) was used as a stirring and warming device. Further, the flow velocity of the electrolytic solution was measured using the vortex flow monitor FLM22-10PCW (manufactured by As One Corporation).

<Barrier Layer Removal Step>

Next, using the same treatment liquid as in the anodizing treatment under the same treatment conditions as in the anodizing treatment, an electrolytic treatment (electrolytic removal treatment) was carried out while continuously decreasing the voltage from 40 V to 0 V at a voltage decrease rate of 0.2 V/sec.

Then, an etching treatment (etching removal treatment) of immersing the anodized film in 5% by mass phosphoric acid at 30° C. for 30 minutes was carried out. As a result, a barrier layer present in the bottom of the micropores of the anodized film was removed, and aluminum was exposed through the micropores.

Here, the average opening diameter of the micropores present in the anodized film having undergone the barrier layer removal step was 60 nm. The average opening diameter was calculated as the average value of opening diameters measured at 50 points after capturing a surface image (magnification: 50,000 times) with a field emission-scanning electron microscope (FE-SEM).

In addition, the average thickness of the anodized film having undergone the barrier layer removal step was 10 µm. That is, the thickness of the insulating base was 10 µm. The average thickness was calculated as the average value of thicknesses measured at 10 positions after cutting the anodized film with a focused ion beam (FIB) in a thickness direction and capturing a surface image (magnification: 50,000 times) of the cross section with FE-SEM.

In addition, the density of the micropores present in the anodized film was about 100,000,000 pores/mm². The density of the micropores was measured and calculated using the method described in paragraphs <0168> and <0169> of JP2008-270158A.

In addition, the degree of regularity of the micropores present in the anodized film was 92%. The degree of regularity was measured and calculated using the method described in paragraphs <0024> to <0027> of JP2008-270158A after capturing a surface image (magnification: 20,000 times) with FE-SEM.

<Metal Filling Step>

Next, an electrolytic plating treatment was carried out by using the aluminum substrate as a cathode and using platinum as a positive electrode.

Specifically, constant current electrolysis was carried out using a copper plating solution having the following composition to prepare a structure in which the micropores were filled with copper.

Here, the constant current electrolysis was carried out using a plating device (manufactured by Yamamoto-MS Co., Ltd.) and a power supply (HZ-3000, manufactured by Hokuto Denko Corp.) under the following conditions after carrying out cyclic voltammetry in the plating solution to check the deposition potential.

(Composition of Copper Plating Solution and Conditions)
Copper sulfate: 100 g/L
Sulfuric acid: 50 g/L
Hydrochloric acid: 15 g/L
Temperature: 25° C.
Current density: 10 A/dm²

<Insulating Substance Filling Step>
<Semi-Cured Epoxy Resin>

The following components were dissolved in methyl ethyl ketone (MEK) at the ratio shown below to prepare a resin layer coating solution with a solid content concentration of 15% by mass.

This coating solution was applied to the surface of the insulating base and dried to form a film.

<Coating Solution Composition>
Elastomer: acrylic acid ester-based polymer having butyl acrylate and acrylonitrile as a main component (trade name: SG-28GM, manufactured by Nagase ChemteX Corporation) 5 parts by mass
Epoxy resin 1: jER (registered trademark) 828 (manufactured by Mitsubishi Chemical Corporation) 33 parts by mass
Epoxy resin 2: jER (registered trademark) 1004 (manufactured by Mitsubishi Chemicals Corporation) 11 parts by mass
Phenolic resin: MILEX XLC-4L (manufactured by Mitsui Chemicals, Inc.) 44 parts by mass
Organic acid: o-anisic acid (ortho anisic acid, manufactured by Tokyo Chemical Industry Co., Ltd.) 0.5 parts by mass
Antioxidant material A: benzotriazole: 0.01% by mass (the amount with respect to the solid content of the pressure sensitive adhesive layer)
Migration prevention material A: trade name IXE "IXE-100" (manufactured by Toagosei Co., Ltd., median diameter: 1 µm, cation exchange, heat resistance temperature: 550° C.) 2.5% by mass
Curing agent (liquid): 1-cyanoethyl-2-ethyl-4-methylimidazole (2E4MZ-CN, manufactured by Shikoku Chemicals Corporation) 0.5% by mass Thereafter, the resin layer was heated to 80° C., and the epoxy resin in a semi-cured (B stage) state was filled into the structure and formed on the surface. In Table 1 below, the epoxy resin in a semi-cured (B stage) state is represented as a semi-cured epoxy resin.

<Polishing Step>

Next, the surface of the structure filled with the metal was subjected to a chemical mechanical polishing (CMP) treatment and 5 µm of the structure filled with both the insulating substance and the metal formed on the front surface was polished to make a smooth front surface.

As a CMP slurry, PLANERLITE-7000 manufactured by Fujimi Corporation was used.

After the micropores were filled with the metal, the surface of the anodized film was observed with FE-SEM, the sealing of 1,000 micropores by the metal was observed to calculate the pore sealing ratio (number of sealed micropores/1,000 pores). The pore sealing ratio was 80%.

In addition, the anodized film after the micropores were filled with the metal was cut with FIB in the thickness direction, the surface image (magnification: 50,000 times) of the cross section was captured and observed with FE-SEM, and the inside of the micropores was confirmed. As a result, it was found that the sealed micropores were fully filled with the metal.

<Trimming Step>

The structure was immersed in a potassium hydroxide aqueous solution (concentration: 0.1 mol/L, solution temperature: 20° C.), the immersion time was adjusted so that the protrusion length of the protrusion of the conductive path was 1,000 nm (refer to Table 1 below), and the front surface of the anodized film of aluminum and the insulating substance were selectively dissolved.

<Step of Partially Removing Insulating Substance (Step of Controlling Protrusion Height of Insulating Filling Portion)>

The structure was immersed in methyl ethyl ketone (MEK), the immersion time was adjusted so that the protrusion length or the recess length of the insulating substance had the desired value in Table 1, and the insulating substance was selectively dissolved. In the column "Protrusion length of insulating substance" in Table 1, the protrusion length is expressed as a positive value and the recess length is expressed as a negative value. That is, the protrusion length in Example 5 is 300 nm, the protrusion length in Comparative Example 1 is 1,000 nm, and the recess length in Example 4 was 1,000 nm. In Examples 1 to 3, 6, and 7, and Comparative Example 2, the insulating substance is flush with the anodized film.

<Washing Step>

After the structure was washed with pure water after the trimming step, the structure was immersed in the fluid listed in the column "Latter half step of washing step" in Table 1 below and dried to cause the copper cylinder as a conductive path to protrude.

<Substrate Removal Step>

Next, the aluminum substrate was removed by dissolution by being immersed in 20% by mass mercury chloride aqueous solution (corrosive sublimate) at 20° C. for 3 hours. Thus, the rear surface of the anodized film was exposed.

<Insulating Substance Filling Step>

The rear surface of the anodized film was filled with an insulating substance. The filling of the rear surface of the anodized film with the insulating substance was performed in the same manner as the filling of the structure with the epoxy resin in a semi-cured (B stage) state and formation on the surface.

<Polishing Step>

Next, the surface from which the aluminum substrate was removed, that is, the rear surface of the anodized film, was subjected to a chemical mechanical polishing (CMP) treatment and 5 µm of the structure filled with all the insulating substance and the metal formed on the rear surface was polished to make a smooth rear surface.

As a CMP slurry, PLANERLITE-7000 manufactured by Fujimi Corporation was used.

<Trimming Step>

The rear surface side of the anodized film was trimmed in the same manner as in the trimming of the front surface of the anodized film.

<Washing Step>

The rear surface side of the anodized film was washed in the same manner as in the washing of the front surface of the anodized film.

Example 2

A structure of Example 2 was prepared in the same manner as in Example 1 except that in the washing step, the fluid for immersion after washing with pure water was changed from the pure water to methyl ethyl ketone (MEK).

Example 3

A structure of Example 3 was prepared in the same manner as in Example 1 except that the filled conductive substance was changed from Cu to Ni.

As the Ni filling method, constant current electrolysis was performed using a nickel plating solution having the following composition and the micropores were filled with nickel.

<Composition of Nickel Plating Solution>
Nickel sulfate: 300 g/L
Nickel chloride: 60 g/L
Boric acid: 40 g/L
Temperature: 50° C.
Current density: 5 A/dm$^2$ Example 4

A structure of Example 4 was prepared in the same manner as in Example 1 except that the filled insulating substance was changed from the epoxy resin in a semi-cured (B stage) state to aluminum hydroxide.

As the aluminum hydroxide filling method, the structure was immersed in pure water at 100° C. for 1 hour.

Example 5

A structure of Example 5 was prepared in the same manner as in Example 1 except that the filled insulating substance was changed from the epoxy resin in a semi-cured (B stage) state to silicon dioxide particles.

As the silicon dioxide particle filling method, the structure was immersed in the following treatment liquid B at 25° C. for 1 hour.

(Treatment Liquid B)
Colloidal silica with a diameter of 20 nm (MA-ST-M manufactured by Nissan Chemical Industries, Ltd.) 0.01 g
Ethanol 100.00 g Example 6

A structure of Example 6 was prepared in the same manner as in Example 1 except that the trimming step and the washing step were changed to the steps shown below.

Trimming step: The treatment time was adjusted to be longer than in Example 1 so that the protrusion length of the conductive path was 7,000 nm (refer to Table 1 below).

Washing step: The fluid for immersion after washing with pure water in the washing step was changed to a supercritical fluid of carbon dioxide.

Example 7

A structure of Example 7 was prepared in the same manner as in Example 1 except that the trimming step was changed to the step shown below.

Trimming step: The immersion time was adjusted to be shorter than in Example 1 so that the protrusion length of the protrusion of the conductive path was 300 nm (refer to Table 1 below).

Comparative Example 1

A structure of Comparative Example 1 was prepared in the same manner as in Example 1 except that the insulating substance filling step of the front surface and the rear surface was changed to the polymer filling treatment step shown below. In Table 1 below, "polymer" was written in the column of the insulating substance of Comparative Example 1.

<Polymer Filling Treatment Step>

Next, the anodized film subjected to the metal filling treatment was immersed in the immersion liquid shown below and dried at 140° C. for 1 minute. Next, the film was irradiated with infrared light having a wavelength of 850 nm and the component in the micropores was cured.

| Radical polymerizable monomer (Formula C below) | 0.4120 g |
| Photothermal conversion agent (Formula D below) | 0.0259 g |
| Radical generator (Formula E below) | 0.0975 g |
| 1-Methoxy-2-propanol | 3.5800 g |
| Methanol | 1.6900 g |

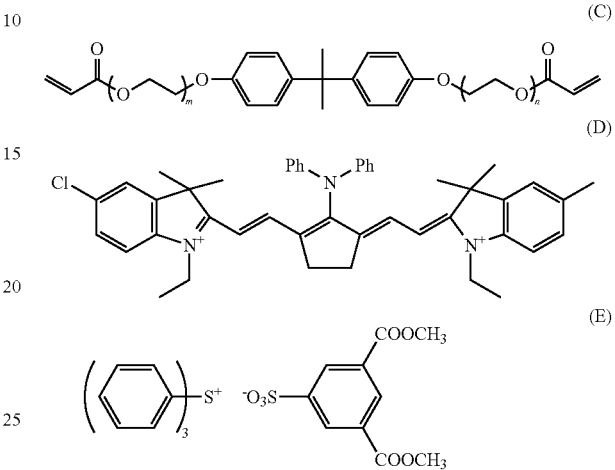

Comparative Example 2

A structure of Comparative Example 2 was prepared in the same manner as in Example 4 except that the trimming step was not performed.

Comparative Example 3

A structure of Comparative Example 3 was prepared in the same manner as in Example 6 except that the insulating substance filling step was not performed.

TABLE 1

| | Length of protrusion of conductive path (nm) | Insulating substance | Protrusion length of insulating substance (nm) | Latter half step of washing step | Conductive substance | Elastic deformation maximum stress (MPa) | Contact rate | Short circuit | Conduction resistance |
|---|---|---|---|---|---|---|---|---|---|
| Example 1 | 1000 | Semi-cured epoxy resin | 0 | MEK | Cu | 80 | 5% | A | A |
| Example 2 | 1000 | Semi-cured epoxy resin | 0 | Pure water | Cu | 80 | 12% | B | A |
| Example 3 | 1000 | Semi-cured epoxy resin | 0 | MEK | Ni | 150 | 3% | A | B |
| Example 4 | 1000 | Aluminum hydroxide | −1000 | MEK | Cu | 80 | 9% | B | A |
| Example 5 | 1000 | Silicon dioxide particles | 300 | MEK | Cu | 80 | 5% | A | B |
| Example 6 | 7000 | Semi-cured epoxy resin | 0 | Supercritical fluid | Cu | 80 | 6% | A | A |
| Example 7 | 300 | Semi-cured epoxy resin | 0 | MEK | Cu | 80 | 2% | A | B |
| Comparative Example 1 | 1000 | Polymer | 1000 | MEK | Cu | 80 | 5% | A | D |
| Comparative Example 2 | 0 | Aluminum hydroxide | 0 | MEK | Cu | 80 | 0% | A | D |
| Comparative Example 3 | 7000 | None | — | Supercritical fluid | Cu | 80 | 80% | D | C |

As shown in Table 1, compared to Comparative Examples 1 to 3, in Examples 1 to 7, the short circuit result and the conduction resistance result were excellent. Thus, it is clear that the structure can be bonded to another member without causing a short circuit, and in a case of bonding to another member, electrical conduction is excellent.

In Comparative Example 1, the protrusion length of the conductive path was the same as the protrusion length of the insulating substance. In Comparative Example 2, neither the conductive path nor the insulating substance protruded. In Comparative Example 3, the structure is not filled with the insulating substance the conductive path is long.

Also, comparing Examples 1 and 3, it is preferable that the filling conductive substance has a maximum stress of 100 MPa or less since the result of conduction resistance is excellent.

Comparing Examples 1 and 2, it is preferable that the contact rate is 10% or less since the result of the short circuit is excellent.

Comparing Examples 1 and 4, in a case where the insulator does not protrude, it is preferable that the recess length is short since the result of the short circuit is excellent.

Comparing Example 5 and Comparative Example 1, in a case where the insulator protrudes, as long as the protrusion length of the insulator is 30% or less of the length of protrusion, the result of conduction resistance is excellent.

Comparing Examples 2 and 6, it is preferable that a liquid having a small surface tension is used since the contact rate can be reduced and the result of short circuit is excellent.

Comparing Examples 1 and 7, it is preferable that the protrusion length of the conductive path is long even in a case where the contact rate is increased since the result of conduction resistance is excellent.

EXPLANATION OF REFERENCES

10: structure
11: laminate
12: insulating base
12a: front surface
12b: rear surface
13: insulating structure
14: through-hole
16: conductive path
17a, 17b: protrusion
18: insulator
18c: end surface
19: void
20: wiring substrate
21: gap
22: electrode
23: insulating layer
24: semiconductor package
26: semiconductor element
30: aluminum substrate
30a: front surface
30b: rear surface
32, 46: double-sided pressure sensitive adhesive
34: support member
36: aluminum base
36a, 38a: front surface
38: anodized film
38b: rear surface
39: micropore
40: metal layer
41: conductive substance
42: insulating substance
44, 45: resin layer
48: support member
49: protective layer
Dt: thickness direction
h: thickness
Ld, δ: protrusion length
p: center-to-center distance
γ: recess length

What is claimed is:

1. A structure comprising:
   an insulating base;
   a plurality of through-holes that are provided in the insulating base and penetrate the insulating base in a thickness direction;
   conductive paths that are constituted of a conductive substance filling the plurality of through-holes; and
   insulators with which the plurality of through-holes are filled and are constituted of an insulating substance different from that of the insulating base,
   wherein both ends of the respective conductive paths are provided with protrusions that protrude from each surface of the insulating base in the thickness direction,
   both ends of the insulators are flush with each surface of the insulating base in the thickness direction, protrude with respect to the surface in the thickness direction, or are recessed from the surface in the thickness direction,
   in a case where the insulators protrude, a protrusion length of the insulators is 30% or less of a protrusion length of the protrusions of the conductive paths, and
   in a case where the insulators are recessed, a recess length of the insulators is 10% or less of a thickness of the insulating base in the thickness direction.

2. The structure according to claim 1,
   wherein a ratio of the protrusions in contact with each other is 10% or less of a total number of the conductive paths.

3. The structure according to claim 1,
   wherein the conductive substance constituting the conductive path has a maximum stress of 100 MPa or less in an elastic region in a case where a compression load is applied.

4. A method for manufacturing the structure according to claim 1, comprising:
   a first step of forming an insulating structure including an insulating base having a plurality of through-holes extending in a thickness direction;
   a second step of filling the through-holes with a conductive substance;
   a third step of filling the through-holes, which are not filled with the conductive substance in the second step among the plurality of through-holes, with an insulating substance; and
   a fourth step of etching the insulating substance.

5. The method for manufacturing the structure according to claim 4,
   wherein the fourth step is etching the insulating base and the insulating substance at the same time and causing the conductive substance filled in the second step to protrude from a surface of the insulating base.

6. The method for manufacturing the structure according to claim 4, further comprising:
   after the fourth step,
   bringing the insulating base into contact with a liquid having a surface tension of 30 mN/m or less; and
   drying the liquid.

7. The method for manufacturing the structure according to claim 4, further comprising:

after the fourth step, immersing the insulating base in a supercritical fluid.

8. A laminate comprising:
the structure according to claim 1; and
a wiring substrate having an electrode,
wherein the conductive path of the structure and the electrode are electrically connected.

9. The laminate according to claim 8,
wherein a gap between the structure and the wiring substrate is filled with an insulating material.

10. A semiconductor package comprising:
a laminate including
the structure according to claim 1, and
a wiring substrate having an electrode,
in which the conductive path of the structure and the electrode are electrically connected and a gap between the structure and the wiring substrate is filled with an insulating material.

* * * * *